United States Patent
Tung et al.

(10) Patent No.: US 12,205,824 B2
(45) Date of Patent: *Jan. 21, 2025

(54) PATTERNING MATERIAL INCLUDING SILICON-CONTAINING LAYER AND METHOD FOR SEMICONDUCTOR DEVICE FABRICATION

(71) Applicant: Taiwan Semiconductor Manufacturing Company, Ltd., Hsinchu (TW)

(72) Inventors: Szu-Ping Tung, Taipei (TW); Chun-Kai Chen, Kaohsiung (TW); Yi-Nien Su, Hsinchu (TW); Tze-Liang Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/357,038

(22) Filed: Jul. 21, 2023

(65) Prior Publication Data
US 2023/0377897 A1    Nov. 23, 2023

Related U.S. Application Data

(63) Continuation of application No. 17/213,723, filed on Mar. 26, 2021, now Pat. No. 11,715,640.
(Continued)

(51) Int. Cl.
*H01L 21/308* (2006.01)
*H01L 21/027* (2006.01)
(Continued)

(52) U.S. Cl.
CPC ...... *H01L 21/3081* (2013.01); *H01L 21/0274* (2013.01); *H01L 21/0332* (2013.01);
(Continued)

(58) Field of Classification Search
None
See application file for complete search history.

(56) References Cited

U.S. PATENT DOCUMENTS

| 9,123,776 B2 | 9/2015 | Tsai |
| 9,147,653 B2 | 9/2015 | Yuan |

(Continued)

FOREIGN PATENT DOCUMENTS

| DE | 102017128235 A1 | 10/2018 |
| JP | 2000200828 A | 7/2000 |

(Continued)

OTHER PUBLICATIONS

D.L. Goldfarb et al., Fundamentals of EUV Resist-Inorganic Hardmask Interactions, Proc. Of SPIE, vol. 10146, paper#1014607. (Year: 2017).

(Continued)

*Primary Examiner* — Jiong-Ping Lu
(74) *Attorney, Agent, or Firm* — Haynes and Boone, LLP

(57) ABSTRACT

In one exemplary aspect, the present disclosure is directed to a method for lithography patterning. The method includes providing a substrate and forming a target layer over the substrate. A patterning layer is formed by depositing a first layer having an organic composition; depositing a second layer including over 50 atomic percent of silicon; and depositing a photosensitive layer on the second layer. In some implementations, the second layer is deposited by ALD, CVD, or PVD processes.

20 Claims, 30 Drawing Sheets

Related U.S. Application Data

(60) Provisional application No. 63/085,519, filed on Sep. 30, 2020.

(51) Int. Cl.
    H01L 21/033    (2006.01)
    H01L 21/311    (2006.01)

(52) U.S. Cl.
    CPC ........ H01L 21/0337 (2013.01); H01L 21/311 (2013.01); H01L 21/31105 (2013.01); H01L 21/31116 (2013.01); H01L 21/31127 (2013.01); H01L 21/31138 (2013.01); H01L 21/31144 (2013.01)

(56) References Cited

U.S. PATENT DOCUMENTS

| | | | |
|---|---|---|---|
| 9,368,349 B2 | 6/2016 | Huang | |
| 9,582,629 B2 | 2/2017 | Yuan | |
| 10,692,769 B2 | 6/2020 | Liang | |
| 11,715,640 B2 * | 8/2023 | Tung | H01L 21/76816 438/694 |
| 2002/0001778 A1 * | 1/2002 | Latchford | G03F 7/091 257/E21.27 |
| 2002/0036289 A1 | 3/2002 | Tamura | |
| 2003/0116531 A1 | 6/2003 | Kamins et al. | |
| 2012/0164846 A1 * | 6/2012 | Ha | H01L 21/02153 257/E21.271 |
| 2012/0329236 A1 * | 12/2012 | Ueda | H01L 28/91 257/E21.011 |
| 2017/0125353 A1 | 5/2017 | Chen | |
| 2017/0256395 A1 | 9/2017 | Raley | |
| 2018/0090335 A1 | 3/2018 | Karve | |
| 2018/0277370 A1 | 9/2018 | Kwon et al. | |
| 2019/0391481 A1 | 12/2019 | Xu | |

FOREIGN PATENT DOCUMENTS

| | | |
|---|---|---|
| JP | 2002075990 A | 3/2002 |
| JP | 2003218346 A | 7/2003 |
| JP | 2009094279 A | 4/2009 |
| JP | 2018098353 A | 6/2018 |
| KR | 1019980063881 A | 10/1998 |
| KR | 1020010087189 A | 9/2001 |
| KR | 1020060129412 A | 12/2006 |
| KR | 1020180097763 A | 8/2018 |

OTHER PUBLICATIONS

A. Silva et al., "Inorganic hardmask development for EUV patterning", Proc. SPIE, vol. 10583, pp. 105830V-1 to 105830V-15. (Year: 2018).

L. Meng et al., "Cost-effetive amorphous silicon hard mask pattering sub-45nm contact trench", 12th IEEE International Conference on Solid-State and Integrated Circuit Technology (ICSICT), paper#978-1-4799-3282-5/14, pp. 1-3. (Year: 2014).

M.A. Dayananda, A direct Derivation of Ficks Law from Continuity Equation for Interdiffusion in Multicomponent Systems, Scripta Materialia, vol. 210 (2022) 114430. (Year: 2022).

H. Xiao, Introduction to Semiconductor Manufacturing Technology, SPIE Press, ISBN 978-0-8194-9092-6, p. 320). (Year: 2012).

* cited by examiner

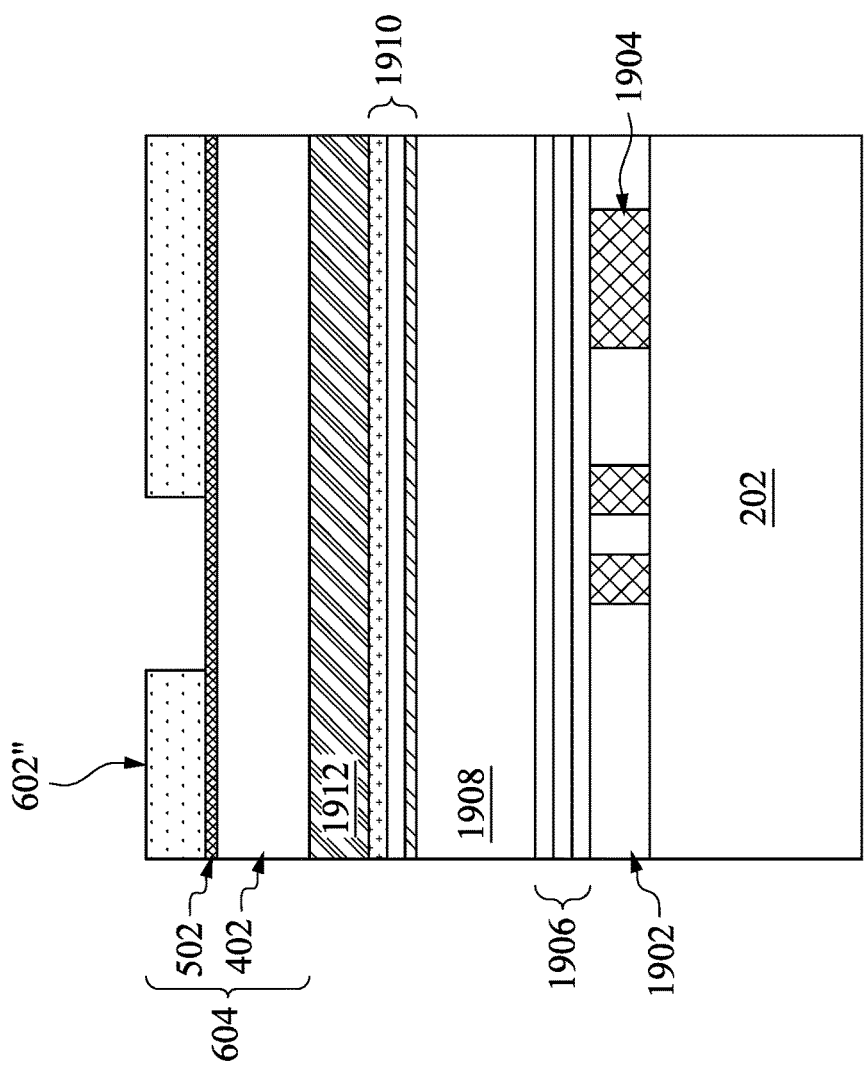
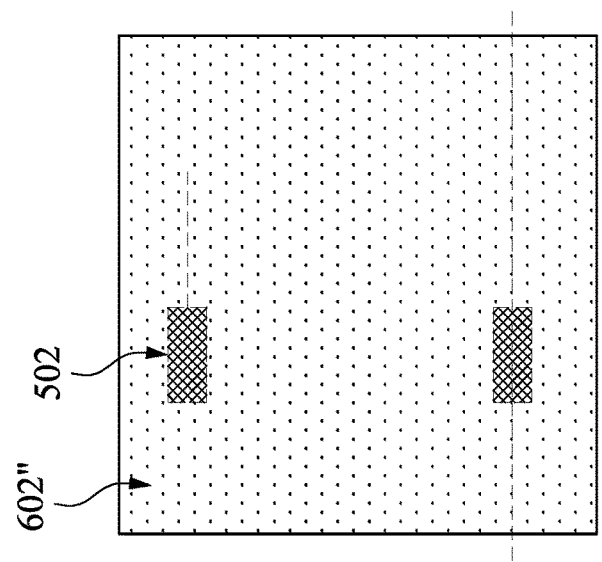
FIG. 20A
FIG. 20B

PATTERNING MATERIAL INCLUDING SILICON-CONTAINING LAYER AND METHOD FOR SEMICONDUCTOR DEVICE FABRICATION

PRIORITY

This application is a continuation application of U.S. patent application Ser. No. 17/213,723, filed Mar. 26, 2021, issuing as U.S. Pat. No. 11,715,640, which claims priority to provisional application 63/085,519, filed Sep. 30, 2020, which are hereby incorporated by reference in their entireties.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

As semiconductor fabrication processes desire smaller process windows, the spacing desired between elements (i.e., the pitch) of a device decreases and becomes more and more difficult to achieve using traditional optical masks and photolithography equipment. Advancements in photolithography tools can assist in meeting the scaled down processes. For example, extreme ultraviolet (EUV) lithography and immersion lithography have been utilized to support critical dimension (CD) requirements of smaller devices. Additionally, patterning methods themselves have developed to drive formation of features of the desired CD below that of the capability of the lithography equipment itself. While the lithography equipment and patterning advances have been suitable in many respects, further advancements are desirable.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 19, 20A, 20B, 21A, 21B, 22, 23A, 23B, 24A, 24B, 25A, 25B, 26A, 26B, 27A, 27B, 28A, 28B, 29A, and 29B provide cross-sectional views of an example device 1900 aspects of which are fabricated according to the method of FIG. 1;

DETAILED DESCRIPTION

Figure 1:
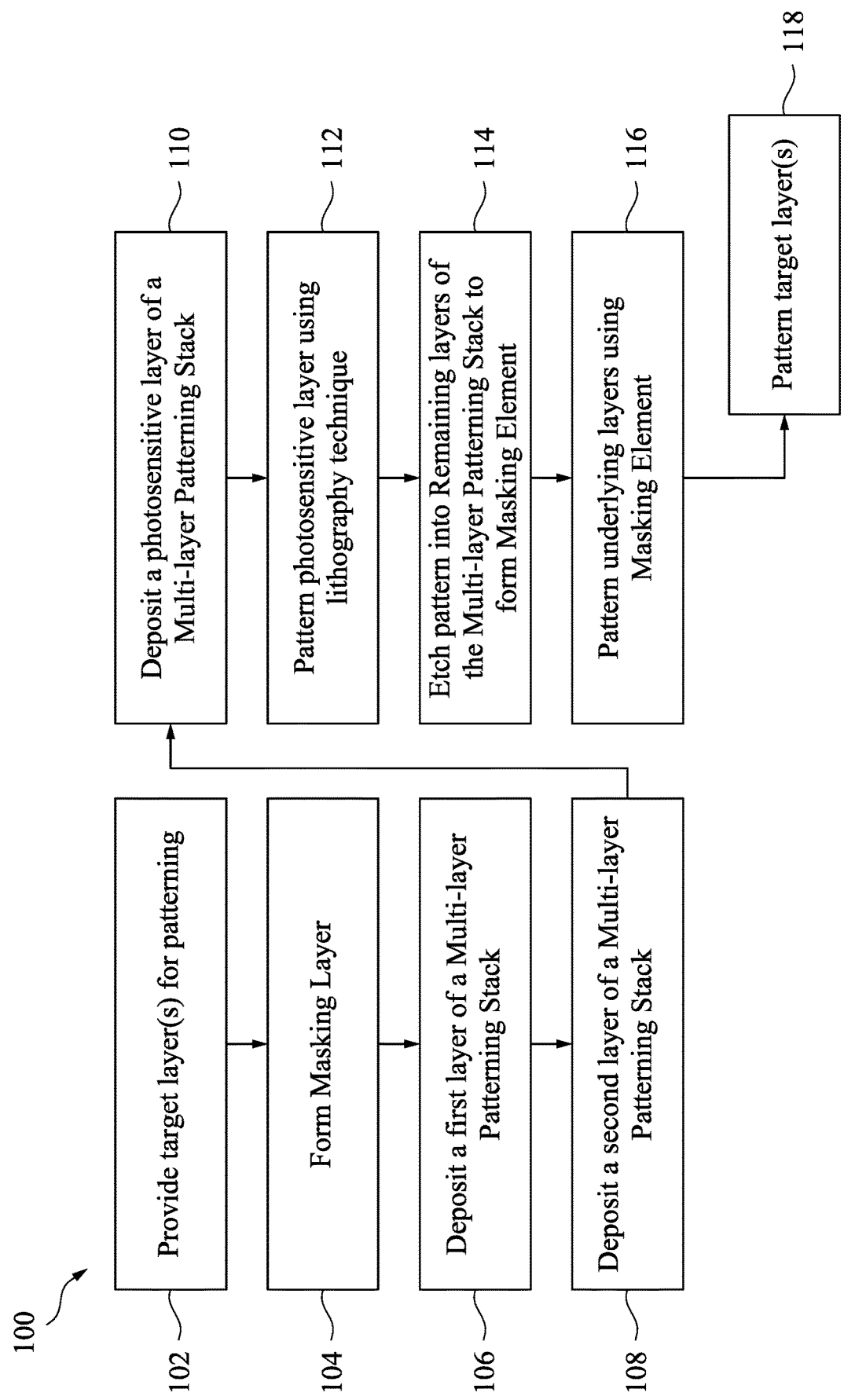
FIG. 1 illustrates a flow chart of an embodiment of a lithography patterning method according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As the pitch of elements of semiconductor devices continue to decrease and dimensions of features continue to shrink, improvements in patterning methods and materials are desired for providing high quality, increased pattern density, and decreased critical dimension (CD) devices. The present disclosure provides for material compositions, material stacks, and methods of implementing said compositions and stacks that can, in some implementations, improve patterning metrics including line width roughness (LWR) and local critical dimension uniformity (LCDU). In some embodiments, the improvements drive the formation of materials using compositions and/or deposition methods that produce high density materials, increased hardness of materials, improved elastic modulus of materials, and/or high etch selectivity of materials that are used in one or more aspects of patterning. These properties alone or in combination can improve LWR and LCDU.

One feature of semiconductor devices for which aggressive dimension and pitch requirements are being implemented is the back-end-of-the-line (BEOL) features. The BEOL features include those wiring or metallization layers providing an interconnection between individual devices of a substrate. In some embodiments, trenches or via openings are patterned into a dielectric layer. By controlling the configuration of the trenches and via openings, a routing of the interconnection of devices is provided when the trenches or openings are subsequently filled with conductive material.

Referring to FIG. 1, illustrated is a method 100 of patterning a layer. The method 100 may be used to pattern a layer of a semiconductor device. The semiconductor device may include SRAM and/or other logic circuits, passive components or active microelectronic devices, such as resistors, capacitors, inductors, diodes, p-type field effect transistors (PFETs), n-type field effect transistors (NFETs), metal-oxide semiconductor field effect transistors (MOSFETs), CMOS transistors, bipolar junction transistors (BJTs), laterally diffused MOS (LDMOS) transistors, high voltage transistors, high frequency transistors, other suitable components, or combinations thereof. Exemplary NFETs and PFETs include multi-gate devices such as fin type field effect transistors (FinFET), gate-all-around (GAA) devices, and/or other suitable device types. The semiconductor device can be included in a microprocessor, a memory, and/or other IC device. In some embodiments, the semiconductor device is a portion of an IC chip, a system on chip (SoC), or portion thereof.

The method 100 may be implemented, in whole or in part, by a system employing deep ultraviolet (DUV) lithography, extreme ultraviolet (EUV) lithography, electron beam (e-beam) lithography, x-ray lithography, and other lithography processes to improve pattern dimension accuracy. In an embodiment, EUV lithography is used to provide an aggressive dimension/pitch of the patterned layer. Additional operations can be provided before, during, and after the method 100, and some operations described can be replaced, eliminated, or moved around for additional embodiments of the method. The method 100 is an example and is not intended to limit the present disclosure beyond what is explicitly recited in the claims. The method 100 is described below in conjunction with FIGS. 2-16.

The method 100 begins at block 102 where a target layer or layers are provided for patterning. The target layer is any layer or layers for which patterning is desired. By patterning the target layer(s), the target layer(s) are configured into a plurality of features, comprised of the target layer, having openings interposing the features. The pattern may be directed to various semiconductor device features such as interconnect lines, gate structures, isolation structures, active regions, and the like. In some embodiments, the target layer pattern is provided below the resolution limit of the lithography equipment due to the patterning methods such as multiple-patterning techniques.

In some implementations, the target layer(s) is provided over a semiconductor structure. The semiconductor structure includes a semiconductor substrate and, in some implementations, various layers or features disposed on the semiconductor substrate. In an embodiment, the semiconductor substrate includes silicon. Alternatively or additionally, substrate includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Within or upon the substrate, there may be various features associated with the semiconductor devices. The features may include transistor features such as gate structures and source/drain regions; isolation features; interconnect features such as metallization layers and vias; and/or other features.

Figure 2:
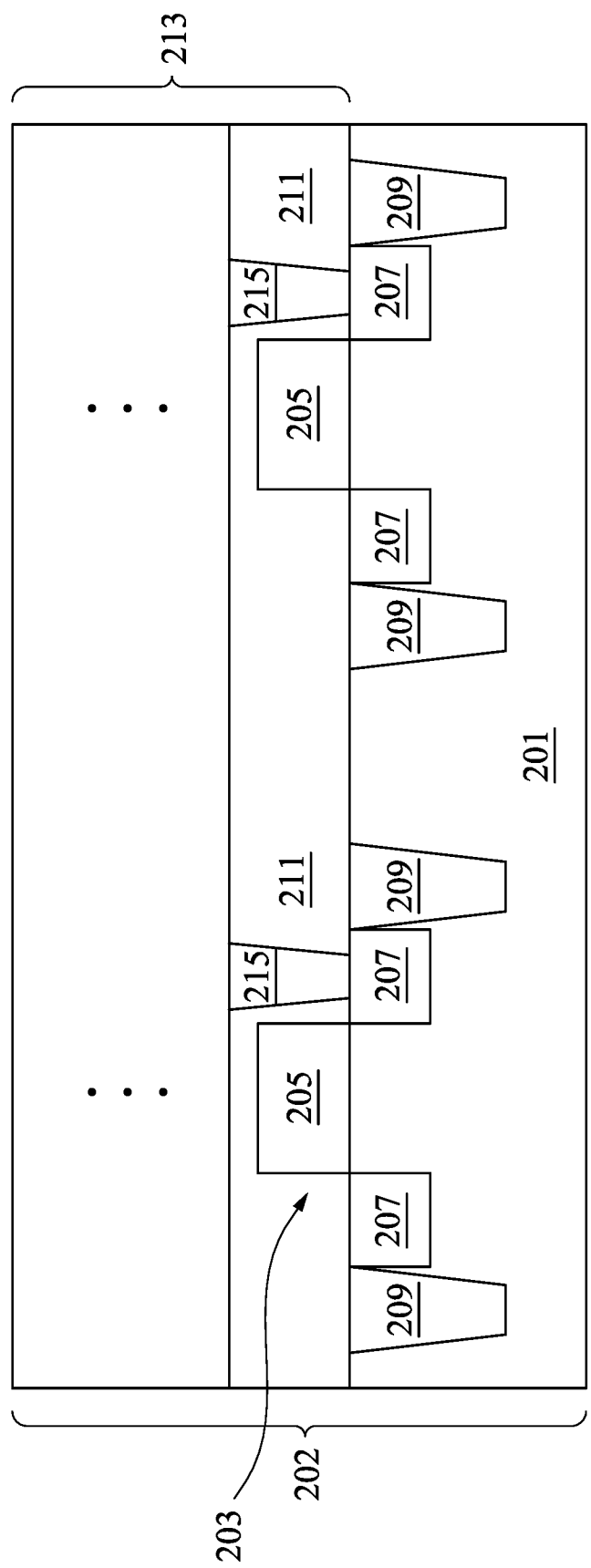
FIGS. 2, 3, 4, 5, 6, 7, 8, 9, 10 11, 12, 13, 14, 15 and 16 provide cross-sectional views of an example device 200 aspects of which are fabricated according to the method of FIG. 1.

As but one example, a semiconductor structure 202 is illustrated in FIG. 2. The semiconductor structure 202 includes a base substrate 201 having a plurality of active devices 203 formed thereon. The devices as illustrated include gate structures 205 and source/drain features 207 having interposing isolation features 209. A multi-layer interconnect (MLI) 213 is formed over the devices 203. The MLI 213 may include a dielectric layer 211 formed over the devices and an illustrative contact 215 extending to the source/drain feature 207. The MLI 213 includes various other metallization layers, vertically extending vias, and interposing isolation layers that connect various features of the devices 203 as discussed below.

The gate 205 is configured to achieve desired functionality according to design requirements of associated device, for example, providing a p-type work function or n-type work function. The gate 205 may include a gate dielectric layer and a gate electrode (for example, a work function layer and a bulk conductive layer). Gate structures 205 may include numerous other layers, for example, capping layers, interface layers, diffusion layers, barrier layers, hard mask layers, or combinations thereof.

Gate dielectric layer(s) of the gate structure may include a high-k dielectric layer, which includes a high-k dielectric material, which refers to a dielectric material having a dielectric constant that is greater than that of silicon dioxide ($k \approx 3.9$). For example, the high-k dielectric layer includes $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material for metal gate stacks, or combinations thereof. The high-k dielectric layer is formed by any of the processes described herein, such as ALD, CVD, PVD, oxidation-based deposition process, other suitable process, or combinations thereof. Gate electrode layer(s) of the gate structure are formed over gate dielectric; gate electrodes includes a conductive material, such as polysilicon, aluminum, copper, titanium, tantalum, tungsten, molybdenum, cobalt, TaN, NiSi, CoSi, TiN, WN, TiAl, TiAlN, TaCN, TaC, TaSiN, other conductive material, or combinations thereof. In some embodiments, a gate electrode includes a work function layer and a bulk conductive layer. The work function layer is a conductive layer tuned to have a desired work function (e.g., an n-type work function or a p-type work function), and the conductive bulk layer is a conductive layer formed over the work function layer. In some embodiments, the work function layer includes n-type work function materials, such as Ti, silver, manganese, zirconium, TaAl, TaAlC, TiAlN, TaC, TaCN, TaSiN, other suitable n-type work function materials, or combinations thereof. In some embodiments, the work function layer includes a p-type work function material, such as ruthenium, Mo, Al, TiN, TaN, WN, $ZrSi_2$, $MoSi_2$, $TaSi_2$, $NiSi_2$, WN, other suitable p-type work function materials, or combinations thereof. The bulk (or fill) conductive layer includes a suitable conductive material, such as Al, W, Ti, Ta, polysilicon, Cu, metal alloys, other suitable materials, or combinations thereof. A gate electrode is formed by any of the processes described herein, such as ALD, CVD, PVD, plating, other suitable process, or combinations thereof.

The source/drain features 207 include doped regions—e.g., n-type dopants and/or p-type dopants—suitable for providing features of the semiconductor device. In some embodiments, the source/drain features 207 comprise epitaxial material. An epitaxy process can use CVD deposition techniques (for example, LPCVD, VPE, and/or UHV-CVD), molecular beam epitaxy, other suitable epitaxial growth processes, or combinations thereof. In some embodiments, for the n-type transistors, epitaxial source/drain features include silicon, which can be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, for the p-type transistors, epitaxial source/drain features include silicon germanium or germanium, which can be doped with boron, other p-type dopant, or combinations thereof (for example, forming Si:Ge:B epitaxial source/drain features).

In some implementations, the isolation features 209 are shallow trench isolation (STI) structures, deep trench isolation (DTI) structures, local oxidation of silicon (LOCOS) structures, other suitable isolation structures, or combinations thereof. The isolation features 209 may include a multi-layer structure of suitable dielectrics such as oxides.

The dielectric layer 211 may be an interlayer dielectric (ILD) part of an MLI. The dielectric layer 211 may include a dielectric material including, for example, silicon oxide, carbon doped silicon oxide, silicon nitride, silicon oxynitride, TEOS-formed oxide, PSG, BSG, BPSG, FSG, xerogel, aerogel, amorphous fluorinated carbon, parylene, BCB-based dielectric material, polyimide, other suitable dielectric material, or combinations thereof. In some embodiments, dielectric layer 211 includes a dielectric material having a dielectric constant that is less than a dielectric constant of silicon dioxide (e.g., k<3.9). In some embodiments, dielectric layer 211 includes a dielectric material having a dielectric constant that is less than about 2.5 (i.e., an extreme low-k (ELK) dielectric material), such as silicon dioxide (SiO2) (for example, porous silicon dioxide), silicon carbide (SiC), and/or carbon-doped oxide (for example, a SiCOH-based material (having, for example, Si—CH3 bonds)), each of which is tuned/configured to exhibit a dielectric constant less than about 2.5. The dielectric layer 211 can include a multilayer structure having multiple dielectric materials.

As introduced above, the MLI 213 includes insulating layers and conductive layers. MLI 213 electrically couples various devices (for example, p-type transistors and/or n-type transistors, resistors, capacitors, and/or inductors) and/or components (for example, gate electrodes and/or epitaxial source/drain features of p-type transistors and/or n-type transistors) disposed on the semiconductor structure 202, such that the various devices and/or components can operate as specified by design requirements of semiconductor device. MLI 213 includes a combination of dielectric layers and electrically conductive layers (e.g., metal layers) configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different layers (or different planes) of MLI 213. During operation, the interconnect features are configured to route signals between the devices and/or the components of devices and/or distribute signals (for example, clock signals, voltage signals, and/or ground signals) to the devices and/or the components of devices.

In some embodiments, other features are present on the semiconductor structure 202 including other portions of active or passive devices and interconnections thereof. In other embodiments, various ones or all of the features or devices discussed above are omitted. For example, in an embodiment, the semiconductor structure 202 includes a substrate 201 such as a silicon substrate and the substrate itself is the target layer to be patterned.

In some implementations, block 102 includes forming a target layer or target layers over the semiconductor structure. In an embodiment, the target layer is an interlayer dielectric (ILD) of a multi-layer interconnect (MLI) such as the ILD layer discussed above. The target layer may be an ILD layer of a higher MLI layer, such as ILD-1, ILD-3 and the like, the numerical designation providing the number of layers above the semiconductor devices. Semiconductor devices can have any number of metallization/ILD layers, in many implementations over 5 or 10 layers. Other examples of target layers may also be possible including a semiconductor substrate, other dielectric layers, semiconductor layers, conductive layers, and/or other suitable layers implemented in semiconductor fabrication.

Figure 3:
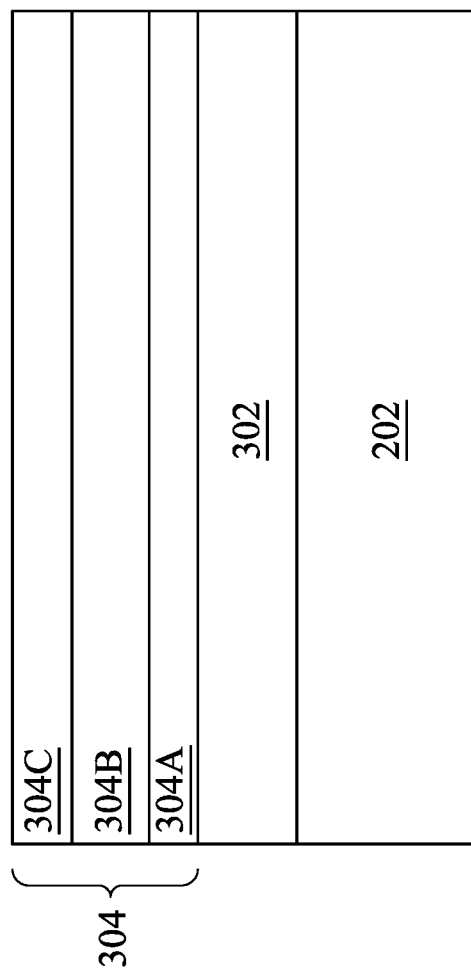

Referring to the example of FIG. 3, a target layer 302 is provided on a semiconductor structure 202. In an embodiment, the target layer 302 is an interlayer dielectric (ILD) part of an MLI. A deposition process (such as CVD, PVD, ALD, HDPCVD, MOCVD, RPCVD, PECVD, LPCVD, ALCVD, APCVD, FCVD, HARP, HDP, other suitable methods, or combinations thereof) may be used to provide the target layer.

In an embodiment, the target layer 302 is an ILD layer including a dielectric material including, for example, silicon oxide, carbon doped silicon oxide, silicon nitride, silicon oxynitride, TEOS-formed oxide, PSG, BSG, BPSG, FSG, xerogel, aerogel, amorphous fluorinated carbon, parylene, BCB-based dielectric material, polyimide, other suitable dielectric material, or combinations thereof. In some embodiments, ILD layer includes a dielectric material having a low-k dielectric or an ELK dielectric. The target layer 302 can include a multilayer structure having multiple dielectric materials.

In other implementations, the target layer 302 may be another dielectric layer, a conductive layer (e.g., interconnection, plate of capacitor, electrode of memory cell, etc.), and/or a semiconductor layer (e.g., gate feature, fin structure, epitaxial layer, etc.) In an implementation, the target layer 302 is a portion of a semiconductor substrate, such as substrate 201. In such a case, the additional elements of the semiconductor structure 202 are not included and the target layer is part of the substrate 201 and/or directly disposed on the substrate 201.

The method 100 then proceeds to block 104 where a masking layer(s) is formed over the target layer. The masking layer may include a hard mask material. In some embodiments, the masking layer may be a sacrificial layer used for patterning and/or protection of underlying layers. In some embodiments, the masking layer may be a multi-layer structure. In a further embodiment, the masking layer is a tri-layer structure including a hard mask layer (e.g., metal-containing, organic) between dielectric material layers. The masking layer may include anti-reflective coating layer(s).

Referring to the example of FIG. 3, a masking layer 304 is formed over the target layer 302. In an embodiment, the masking layer 304 includes a first layer 304A, a second layer 304B, and a third layer 304C. In some implementations, the first layer 304A and the third layer 304C include silicon oxide or another dielectric material. In some implementations, the second layer 304B includes a hard mask material such as a metal hard mask material. In an embodiment, the metal hard mask material is TiN. Other exemplary metal hard mask materials include Ti, Ta, W, TaN, WN, and/or other suitable compositions. In other embodiments, the second layer 304B is an organic hard mask. In other embodiments, the hard mask layer is differently configured based upon the lithography needs.

In some implementations, the thickness of the first layer 304A and/or the third layer 304C are between approximately 100 Å and 500 Å. In a further embodiment, the thickness of the first layer 304A and/or the third layer 304C are between approximately 200 Å and 300 Å. In some implementations, the thickness of the second layer 304B is between approximately 100 Å and 500 Å. In a further embodiment, the thickness of the second layer 304B is between approximately 200 Å and 300 Å. The selected thickness depends upon the etch film selectivity and the etch process parameters. For example, the closer the etch selectivity between materials, an increased thickness may be beneficial. In an embodiment, the masking layer of block 104 is omitted.

The method 100 then proceeds to block 106 where a first layer of a multi-layer patterning stack is deposited. In some implementations, the multi-layer patterning stack may include three-layers as discussed below. For example, the three layers may include a top or image layer, a middle or transfer layer, and a bottom or base layer. These layers are discussed in the order of deposition, i.e., from bottom to top with respect to blocks 106, 108 and 110 of the method 100. In some embodiments, the multi-layer patterning stack provides an organic/inorganic/organic stack of layers.

In an embodiment, block 106 deposits the first layer (e.g., base or bottom layer) of a multi-layer patterning stack. The first layer may comprise organic material. In an embodiment, the first layer is a BARC layer. The BARC material may be an organic material selected for the photolithography process to be performed in block 112. In an embodiment, the BARC material is an anti-reflective coating suitable for radiation at 13.5 nm (EUV), now known or later developed. In an embodiment, the BARC is a formed by spin-on coating. In an embodiment, the first layer is a spin-on organic hard mask (SOHM).

In other embodiments, the first layer may comprise a carbon-based material having a carbon (C) composition greater than fifty (50) atomic percent % In addition to the carbon, other components of the carbon-containing layer include hydrogen (e.g., amorphous hydrogenated carbon). In an embodiment, the carbon-based layer is amorphous carbon (a-Carbon). In some embodiments, no other atomic components are purposefully deposited in forming the carbon-containing layer, e.g., other than carbon and hydrogen. For example, the atomic percent of carbon may be between approximately 50 and 75% and the remaining 50 to 25 atomic % may be hydrogen. In a further embodiment, the atomic percent of carbon is approximately 65 atomic % and the atomic percent of hydrogen is approximately 35 atomic %. In some implementations, the first layer of carbon-containing material is deposited by chemical vapor deposition (CVD) process such as plasma-enhanced CVD (PECVD). Other CVD processes include high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), sub-atmospheric vapor deposition (SAVCD), or other suitable methods. In an embodiment, the first layer of carbon-containing material is deposited by physical vapor deposition (PVD) such as plasma enhanced (PE) PVD. Other PVD processes include sputtering, electron beam, thermal evaporation, or other suitable methods. In an embodiment, the first layer of carbon-containing material is deposited by atomic layer deposition (ALD) such as plasma-enhanced (PE) ALD.

In some implementations, the first layer is provided as a BARC layer and is formed to a thickness of between 500 Angstroms and 1000 Angstroms (Å). In a further embodiment, the first layer is a deposited (e.g., PVD, CVD, ALD) carbon-containing layer and has a thickness of between approximately 50 and 500 Å. In a further embodiment, the thickness is between approximately 200 and 300 Å. The thickness of the carbon-containing layer may be selected based on the etch selectivity to surrounding layers, the tuning of the etching process, the underlying topography, and/or other criteria. For example, a topography underlying the carbon-containing first layer having a high-aspect ratio may demand an increased thickness to suitably cover the topography. In an embodiment, an underlying topography necessitates depositing the first layer by spin-on coating to provide suitable coverage for the topography (e.g., gap fill). In an embodiment, the etch selectivity between the carbon-containing layer and the underlying layer (e.g., masking layer, target layer, intervening layer) may impact the thickness, for example, a greater thickness may be required for a decreased selectivity between the carbon-containing layer and the target layer.

In some embodiments, prior to forming the first layer, another layer is formed between the hard mask and the first layer. In certain implementations, this layer is a mandrel layer, such as a layer used to form mandrels in a double patterning process. In other embodiments, the carbon-containing layer is deposited directly on the masking layer (e.g., 304C), such as in the single patterning process.

Figure 4:
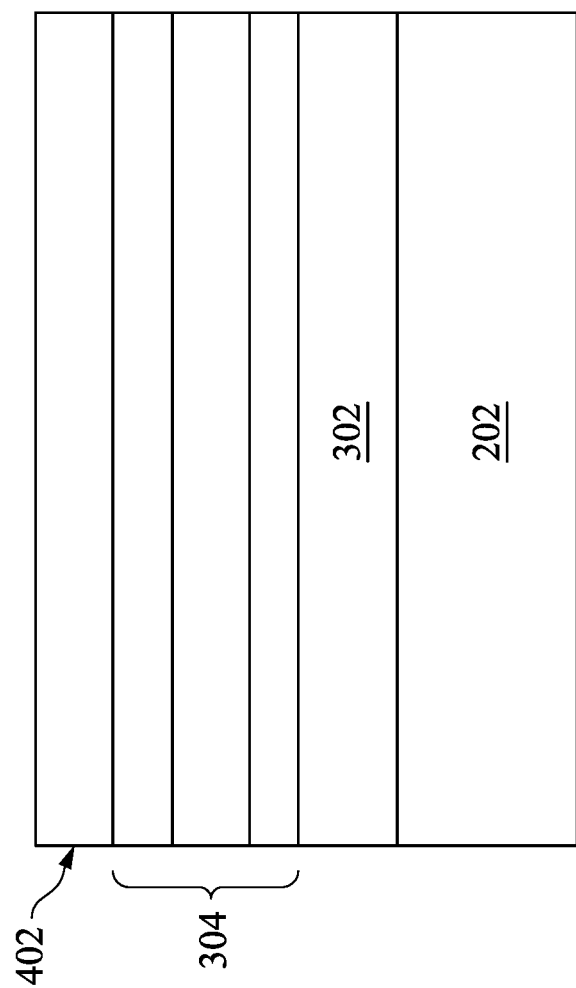

Referring to the example of FIG. 4, a bottom layer 402 is formed over the semiconductor structure 202. In an embodiment, the bottom layer 402 is a BARC provided by spin-on coating. In an embodiment, the bottom layer 402 may be a carbon-containing layer (e.g., amorphous carbon) as discussed above that may be deposited by one of PVD, ALD, or CVD processes.

The method 100 then proceeds to block 108 where a second layer of a multi-layer patterning stack is deposited. The second layer of a multi-layer patterning stack may be a silicon-containing layer.

In some embodiments, the second layer may comprise a silicon-based material having a silicon (Si) composition greater than fifty (50) atomic percent %. In an embodiment, the silicon-containing second layer is amorphous silicon. In a-Si, the atoms form a continuous random network with numerous unconnected dangling bonds. Other components of the silicon-containing layer include hydrogen, thus providing hydrogenated amorphous silicon (e.g., a-Si:H) for example, attaching the dangling bond sites. In some embodiments, the second layer as deposited consists of silicon and hydrogen and other atoms are not provided. In the present disclosure, a reference to amorphous silicon (a-Si) is inclusive of a-Si:H. In some implementations, the percentage of H present in the a-Si is dependent on the desired properties of the layer, for example, increasing H may increase the hardness. Exemplary compositions for the a-Si layer include between over 50 atomic % Si to 75 atomic % Si and less than 50 atomic % H to 25 atomic % H.

In some implementations, the second layer of silicon-containing material (e.g., a-Si) is deposited by chemical vapor deposition (CVD) process such as plasma-enhanced CVD (PECVD). Other CVD processes include high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), sub-atmospheric vapor deposition (SAVCD), other suitable methods. In an embodiment, the second layer of silicon-containing material is deposited by physical vapor deposition (PVD) such as plasma enhanced (PE) PVD. Other PVD processes include sputtering, electron beam, thermal evaporation. In an embodiment, the second layer of silicon-containing material is deposited by atomic layer deposition (ALD) such as plasma-enhanced (PE) ALD. The deposition of the silicon-containing layer (e.g., PVD, ALD, CVD processes) can be characterized as using process(es) where molecules of chemical compounds serving as precursors are delivered to the substrate surface and chemically modified to obtain the desired film. These depositions processes are in contrast to spin-coating or dip-coating processes.

In some implementations, the deposition of the silicon-containing layer by the methods discussed above includes providing a precursor reactive gas and an inert gas. Example precursors include silicon-containing compounds. In an embodiment, the precursor includes a silicon source such one of silane (SiH4) or disilane (Si2H6). Example inert gases include nitrogen, argon, helium, xenon, other suitable carrier gas constituent, or combinations thereof. In an embodiment, the inert gas includes at least one of argon (Ar) or helium (He). The silicon-containing layer may be deposited by introduction of gases precursors (with inert gases) to a chamber, where a heated semiconductor structure is disposed. Reactions between the precursors (and/or surface of the semiconductor structure) creates a solid film layer of silicon-containing material on the semiconductor structure. This process may be performed by the tool illustrated in FIG. 30, discussed below.

The deposition process of the silicon-containing first layer of a multi-layer patterning stack may include a process temperature of between room temperature (RT) to 600 degrees Celsius. The deposition process of the silicon-containing first layer of a multi-layer patterning stack may include a process pressure of between approximately zero (0) and 100 torr. In an embodiment, the temperature and/or pressure are determined to provide suitable dissociation of the precursors and/or excitability of the silicon atoms. In an embodiment, the process temperature is a temperature of the wafer and/or the process chamber. The power of the deposition may be between approximately 10 and 25 MHz. The power is selected to provide suitable disassociation and reaction of the precursors. The greater the power the higher the disassociation but may risk arcing or other issues in tool performance.

In some implementations, the silicon-containing second layer is deposited to a thickness of 50 to 500 Angstroms (Å). In a further embodiment, the thickness of the silicon-containing film is between approximately 100 and 200 Å. The thickness of the silicon-containing layer may be selected based on the etch selectivity to surrounding layers and the tuning of the etching process to provide suitable pattern transfer performance.

Figure 30:
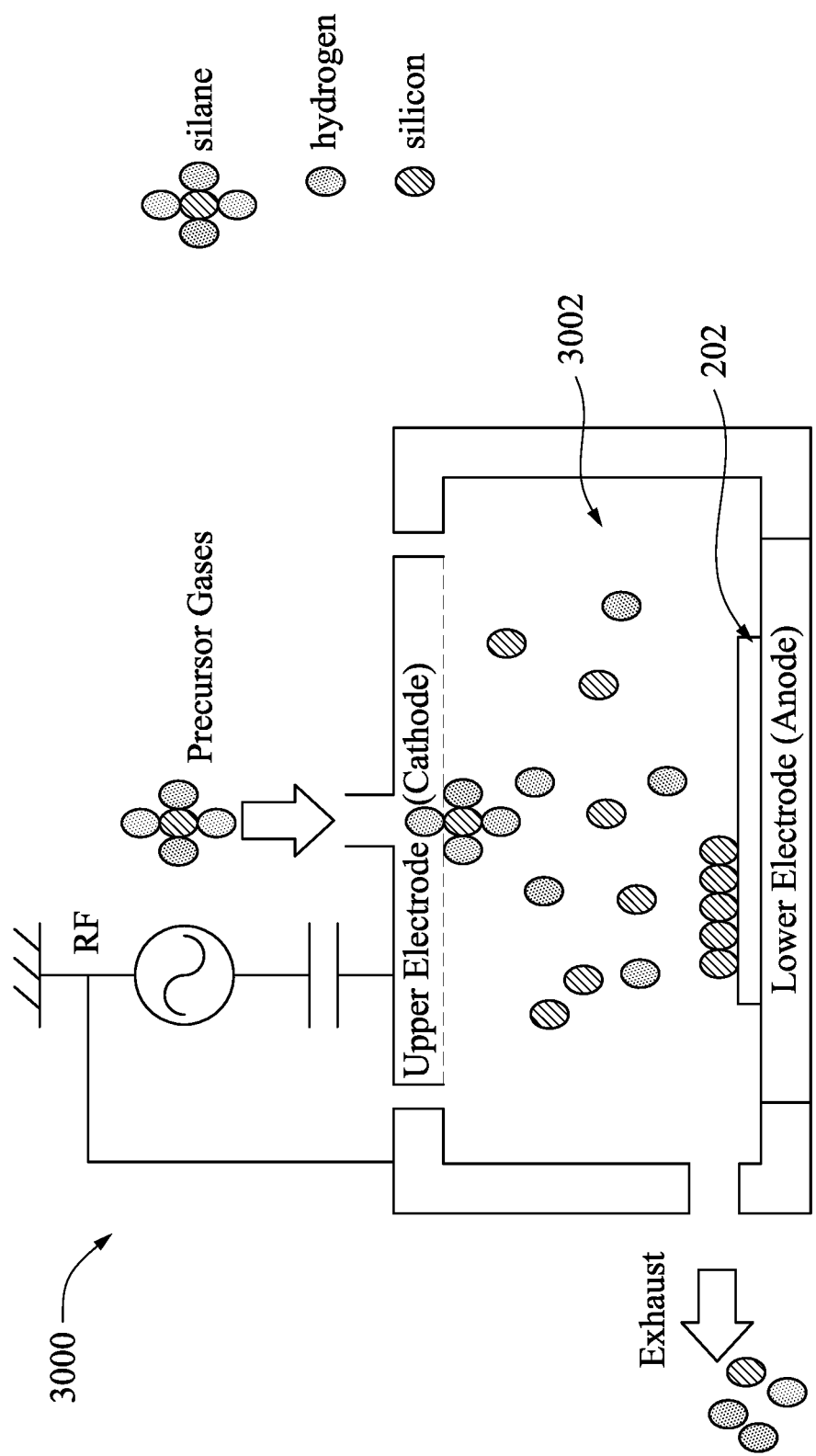
FIG. 30 provides a schematic illustration of a portion deposition tool that may be used according to various aspects of the present disclosure.

In some embodiments, the silicon-containing layer is deposited directly on the first layer. Thus, in some implementations, a spin-on organic coating (e.g., BARC) is directly interfacing an amorphous silicon layer to provide the base layer and the middle layer of a tri-layer stack. In an embodiment, a carbon-containing layer (e.g., greater than 50% atomic carbon, such as a-C) is directly interfacing an amorphous silicon layer. In some implementations, these depositions of block 106 and 108 are performed in-situ for example, in a tool such as illustrated in FIG. 30 below. In some embodiments, block 108 is provided in a tool such as illustrated in FIG. 30, while block 106 includes spin-on coating the silicon-containing layer.

In an embodiment, the interface between the silicon-containing layer and the carbon-containing layer may be a discrete interface transitioning from a-C to a-Si. In some embodiments, a structure is formed with a continuous variation in the C to Si ratio.

In some implementations of the method 100, as discussed above the silicon-containing layer is deposited as amorphous silicon through, for example, CVD, PVD, or ALD processes. In some embodiments, the a-Si material is subsequently modified in composition. For example, during a subsequent patterning step of the a-Si, an etching process may alter this composition (a-Si) in whole or in part. For example, when implementing an oxygen-comprising etch gas (for example, O2), the silicon-containing layer may getter oxygen atoms from the etchant gas. Further, when an etching process (e.g., comprising an oxygen-comprising etch gas) etches the underlying carbon-containing layer, the silicon-containing layer may getter oxygen and/or carbon that converts some or all of the deposited a-Si material to an $SiO_2$ polymer composition. In some implementations, this conversion (e.g., addition of oxygen or carbon) occurs at a portion of the silicon-containing layer surfaces exposed during the etching process.

Figure 5:
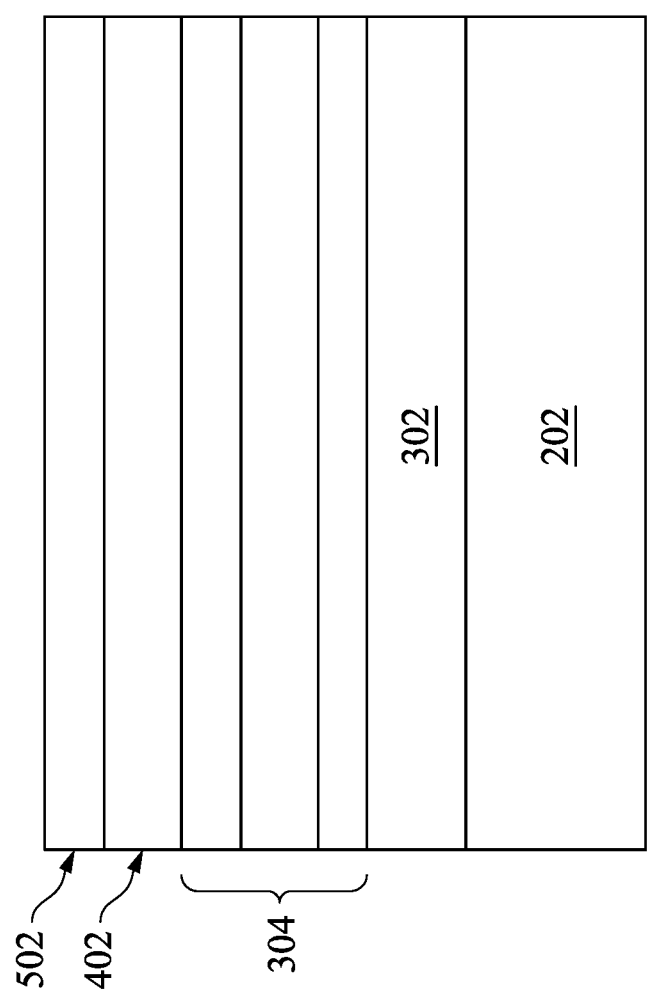

Referring to the example of FIG. 5, a middle layer 502 is formed over the semiconductor structure 202. In an embodiment, the middle layer 502 is a silicon-containing layer as discussed above including over 50 atomic % of Si and being deposited by at least one of PVD, ALD, or CVD. For example, in some embodiments, the middle layer 502 is amorphous silicon.

The method 100 then proceeds to block 110 where a photosensitive layer of the multi-layer patterning stack is deposited. The photosensitive layer may also be referred to as a photoresist or simply resist. The resist layer may be deposited by spin coating process. For example, the spin-coating may include applying a liquid polymeric material onto the semiconductor structure 202 (e.g., the middle layer 502). In an embodiment, the resist layer is a radiation sensitive material to the desired wavelength, such as a photoresist including an I-line resist, a DUV resist including a krypton fluoride (KrF) resist and argon fluoride (ArF) resist, a EUV resist, an electron beam (e-beam) resist, and an ion beam resist. In a further embodiment, the resist is a 193-nm resist. In a further embodiment, the resist is an EUV resist sensitive to the 13.5 nm wavelength exposure of an EUV lithography process. In an embodiment, the resist is sensitive to EUV radiation and is further for negative-tone development (NTD), i.e., its solubility in a NTD developer decreases upon EUV radiation.

The resist layer may include a polymer back-bone and one or more photosensitive components targeted to the radiation wavelength to be used to pattern the resist layer. The wavelengths include those associated with lithography processes such as deep ultraviolet (DUV) lithography, extreme ultraviolet (EUV) lithography, electron beam (e-beam) lithography, x-ray lithography, and/or other lithography processes. In an embodiment, the resist that employs the chemical amplification is generally referred to as a "chemically amplified resist (CAR)." The photoresist includes a polymer that resists to etching or ion implantation; an acid generating compound (e.g., photo acid generator (PAG)); and a solvent. In some examples, the polymer also includes at least one acid labile group (ALG) that responds to acid. In some embodiments, the resist includes polymeric chemically amplified for example by polyhydroxystyrene (PHS)

group providing sensitivity to EUV lithography for example. In some implementations, non-chemically amplified resist is provided such as polymethylmethacrylate (PMMA) resists. While many resist options are organic, inorganic resists are also possible.

In some embodiments, the resist layer is formed directly on the middle or second layer (e.g., a-Si). In some embodiments, a small amount of silicon oxide (e.g., native SiO2) is formed on the top of the a-Si layer and the resist layer is formed thereon. In other embodiments, such as discussed below, an adhesion layer interposes the resist layer and the middle layer.

Figure 6:
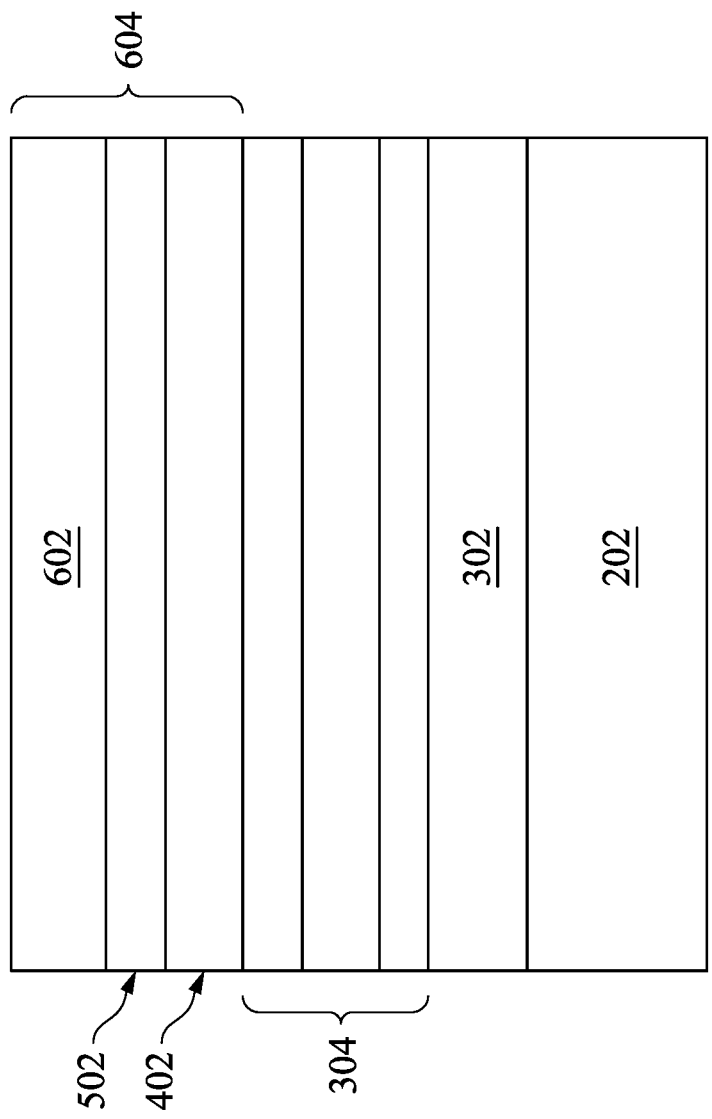

Referring to the example of FIG. 6, a resist layer 602 is deposited. The resist layer 602, the middle layer 502 and the bottom layer 402 provide the multi-layer patterning stack 604, in particular, a tri-layer stack.

The method 100 then proceeds to block 112 where the photosensitive layer is patterned using a lithography technique. After deposition of the resist layer, which may be conformal, in some implementations the photolithography process includes performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. In some implementations, the method includes using immersion lithography. Since the resist layer is sensitive to radiation energy as discussed above, exposed portions of the resist layer chemically change, and exposed (or non-exposed) portions of the resist layer are dissolved during the developing process depending on characteristics of the resist layer and characteristics of a developing solution used in the developing process. That is, in lithography patterning, after a resist film is exposed to a radiation, such as a EUV radiation (or alternatively other radiation, such as an electron beam), it is developed in a developer (a chemical solution). The developer removes portions (such as exposed portions as in a positive-tone photoresist or unexposed portions as in a negative-tone photoresist) of the resist film, thereby forming a resist pattern which may include line patterns and/or trench patterns. After development, the patterned resist layer includes a resist pattern that corresponds with the mask. It is noted that in some implementations, the first layer and the silicon-containing layer are not affected (e.g., no chemical change) from the exposure or development. In an embodiment, the a-Si composition of the second layer interfaces the patterned resist.

Figure 7:
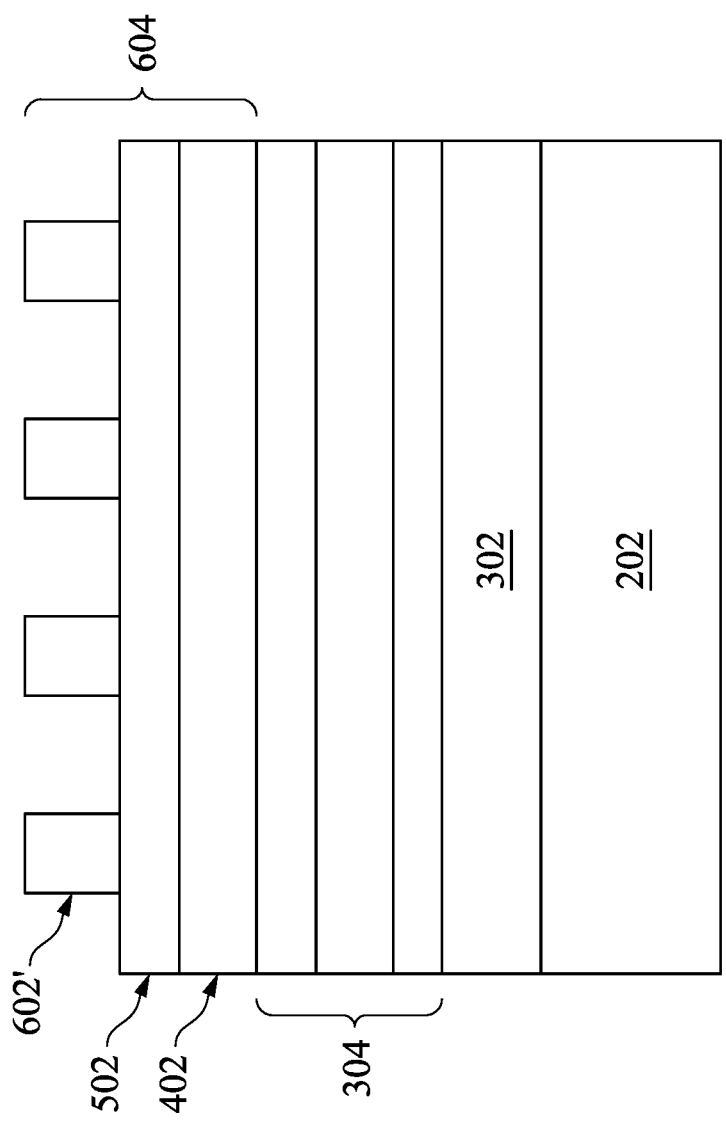

Referring to the example of FIG. 7, the resist layer 602 is patterned to form a series of masking element features 602' comprised of exposed and developed resist, and interposing openings. In an embodiment, the pattern is provided by an EUV lithography technique as discussed above.

The method 100 then proceeds to block 114 where the pattern of the photosensitive layer is etched into the remaining layers of the multi-layer patterning stack to form a masking element. FIGS. 8, 9, 10, and 11 exemplify the etching process(es) used to create the masking element by etching the pattern of the resist layer 602' into the underlying middle layer 502 and bottom layer 402 of the tri-layer patterning stack 604. The etching process(es) may include a reactive ion etch or plasma etching system. The etching process may implement a hydrogen-comprising etch gas (e.g., H2 and/or CH4), a nitrogen-comprising etch gas (for example, N2 and/or NH3), a chlorine-comprising etch gas (for example, Cl2, CHCl3, CCl4, and/or BCl3), an oxygen-comprising etch gas (for example, O2), a fluorine-comprising etch gas (for example, F2, CH3F, CH2F2, CHF3, CF4, C2F6, SF6, and/or NF3), a bromine-comprising etch gas (e.g., Br, HBr, CH3Br, CH2Br2, and/or CHBr3), an iodine-comprising etch gas, other suitable etch gas, or combinations thereof. In some embodiments, the dry etching process can use a carrier gas to deliver the etch gas. The carrier gas includes nitrogen, argon, helium, xenon, other suitable carrier gas constituent, or combinations thereof.

Figure 8:
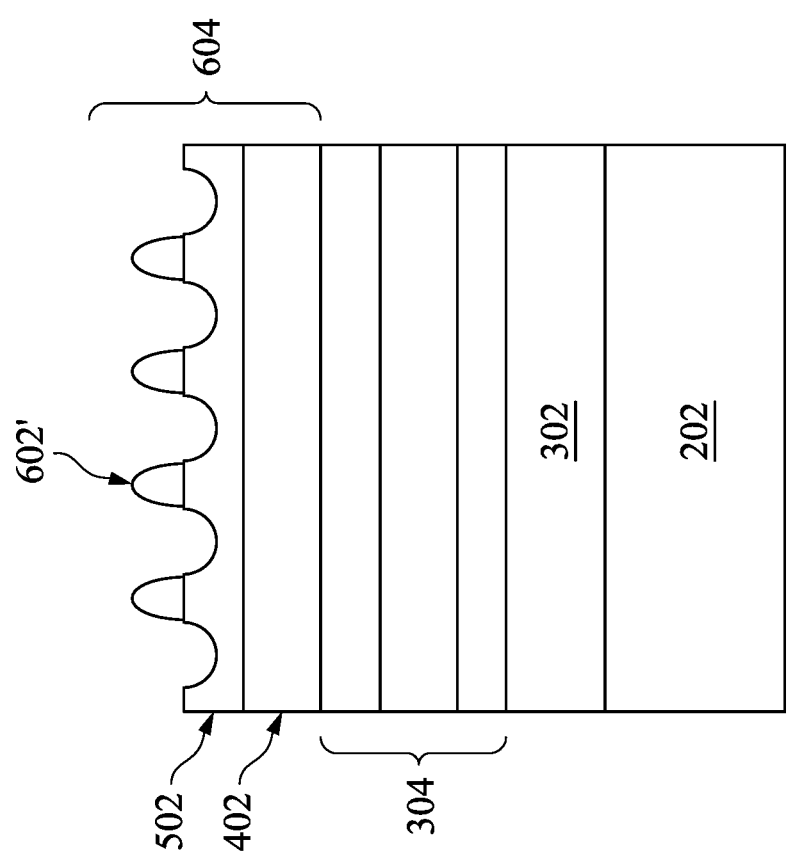
Figure 9:
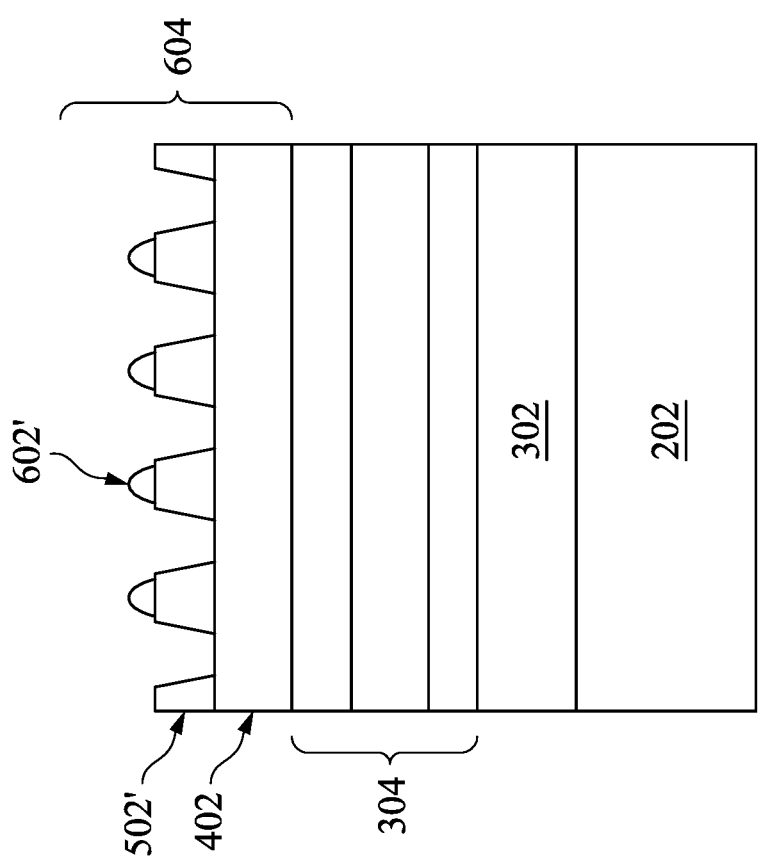

In some implementations, a first step of block 114 is a "descum process." The descum process may remove (residual) portions of the resist from areas where they are not intended to be, for example if the fidelity to the intended pattern is not complete. This process removes the undesired residual resist material, while also decreasing the desired patterned resist in height. In some embodiments, the descum process may slightly etch the underlying middle layer (a-Si) of the multi-layer patterning stack. FIG. 8 is illustrative of the configuration of the multi-layer patterning stack after the descum process including slight etching into the middle layer 502. The height of the resist features 602' has been decreased and in some implementations, the top surface rounded. A variety of etching conditions can be chosen for this descum step such as etching steps including an O2/Ar-based descum, a CF4/CHF3-based descum, and/or other suitable etchants. As discussed above, in some implementations, the descum step introduces oxygen (or carbon) atoms that can be gettered by the a-Si middle layer including at the regions of curvilinear, recessed top surface of the a-Si middle layer.

Block 114 may proceed to include an etching process of the middle layer, or the silicon-containing layer. In an embodiment, this etching process provides an etch selective to the silicon-containing layer, such as selective silicon. The etching process patterns the silicon-containing middle layer according to the pattern of the resist. Referring to the example of FIG. 9, the middle layer 502 is etched providing a patterned middle layer 502'. The etching of the middle layer 502 may stop at a top surface of the bottom layer 402. In some implementations, the patterned middle layer 502' includes tapered sidewalls, for example, due to the directional etching and the post-descum profile. The dry (e.g., plasma) etching process may include an oxygen-comprising etch gas (for example, O2), a fluorine-comprising etch gas (for example, F2, CH3F, CH2F2, CHF3, CF4, C2F6, SF6, and/or NF3), a bromine-comprising etch gas (e.g., Br, HBr, CH3Br, CH2Br2, and/or CHBr3), and/or other suitable etchants. As discussed above, in some implementations the etchant introduces atoms (e.g., oxygen) into the surroundings which are gettered by the patterned second layer.

The patterned middle layer 502', e.g., patterned a-silicon layer, may have an improved line edge roughness (LER) because of the beneficial properties achieved for its composition during the deposition step (e.g., density, modulus, hardness) as discussed above.

Block 114 may proceed to include an etching process of the bottom layer. The etching process patterns the organic bottom layer according to the pattern of the resist and/or the patterned middle layer. In some implementations, the resist layer 602' is removed during the etching process of the bottom layer 402. For example, if the compositions of bottom layer 402 and the resist layer 602 are similar (e.g., organic carbon-based), the etchant may remove both compositions. As discussed above, in some implementations the etchant introduces atoms from the adjacent layers (e.g., carbon from the first layer) into the surroundings, which are then gettered by the patterned second layer.

Figure 10:
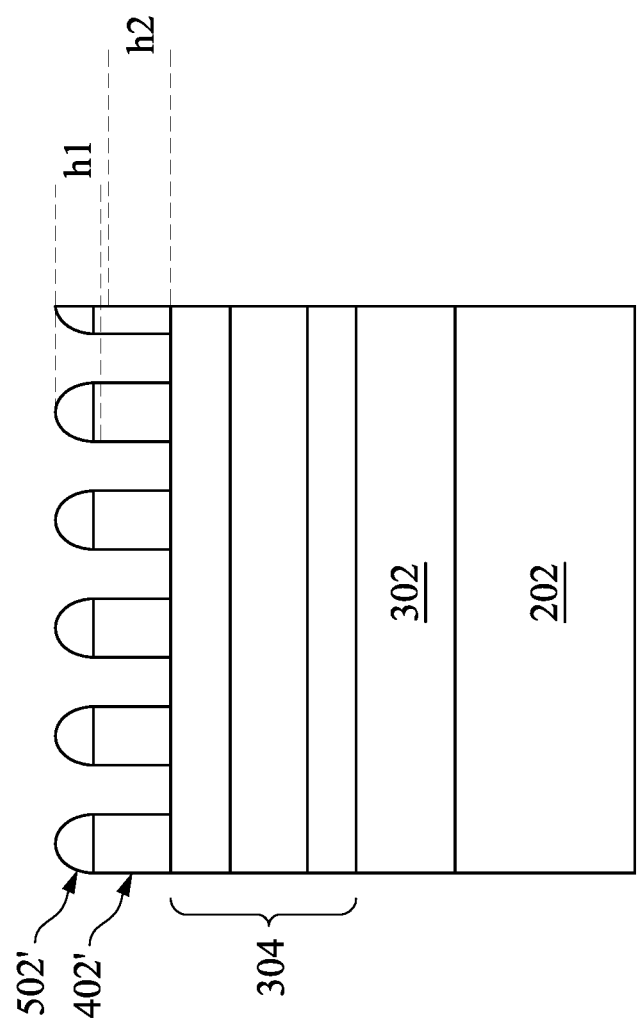
Figure 11:
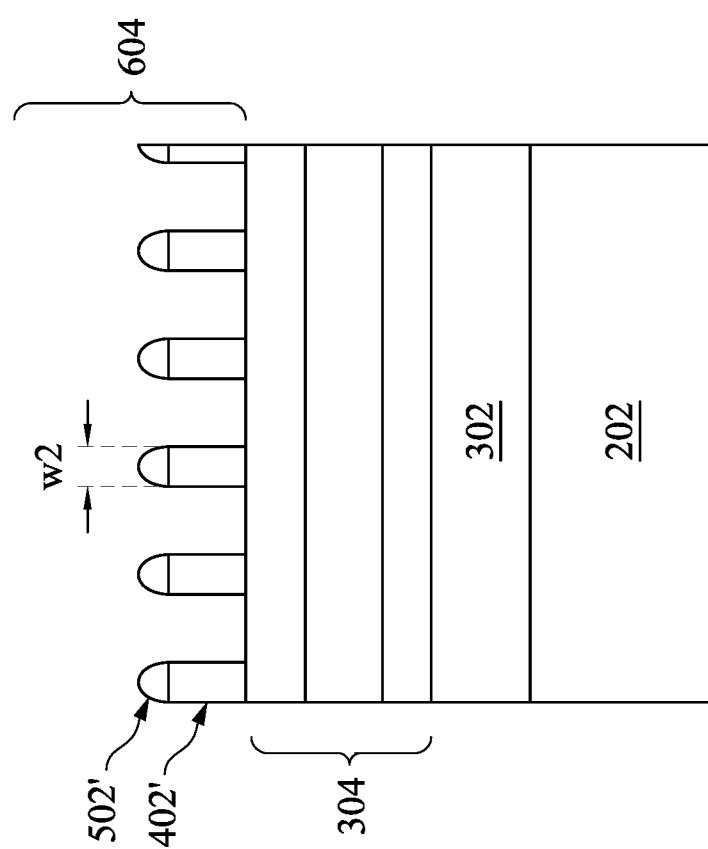

Referring to the example of FIG. 10, the bottom layer 402 is etched providing a patterned bottom layer 402'. The etching of the bottom layer 402 may stop at a top surface of the masking layer 304.

A benefit of some embodiments of the method 100 is that after and during the etching process to pattern the bottom layer 402, there may be less loss of the patterned middle layer 502' due to the composition and deposition method of the middle layer 502. In some implementations, for example, when not providing an a-Si deposited layer by ALD, PVD, or CVD as discussed above, the patterned middle layer 502' (e.g., SOG, SiOC, SiON) may be fully or substantially removed from the device. In an embodiment where a-Si is provided as a silicon-containing layer as discussed above, at least at height h1 of the patterned middle layer 502' may remain. In some embodiments, the height h1 is at least 5 nm. In some embodiments, a height h1 of approximately 5-15 nm remain. In an embodiment, a ratio of h1 to h2 is approximately 1:2.5 to 1:5. In an embodiment, a ratio of h1 to d1 is 2:1 to 10:1. This remaining height h2 may result from an improved etch selectivity between the second layer and the first layer. In some implementations, the gettering of atoms (e.g., oxygen) discussed above furthers this etch selectivity.

In some implementations of the method 100 and block 114, the resultant patterned silicon-containing layer (and bottom layer) may be trimmed, which refers to a reduction in width of the features. Referring to the example of FIG. 11, the patterned features 502' and 402' are decreased in width (x-direction) to provide thinner features (w2). The trimming may be performed by suitable etching process such as an isotropic etch to achieve the desired dimension (e.g., critical dimension). In some implementations, the trimming process may reduce the dimension below the lithography limit of the process implemented in block 112. The trimming may decrease the width by, for example, 10-30%. It is noted that the if the resultant width w2 is too thin, the aspect ratio of the patterned features may risk collapse.

The method 100 then proceeds to block 116 where the resultant patterned features of the multi-layer patterning stack are used as a masking element during the patterning of underlying layers such as masking layers. The patterning of the underlying layers is dependent on the patterning method being implemented by the method 100. In some embodiments, a target layer may be directly patterned using the masking element provided by the patterned multi-layer patterning stack and thus, block 116 is omitted from the method 100. In some embodiments, other patterning layers such as the underlying masking layer(s) (e.g., metal hard mask) may be directly patterned using the masking element provided by the patterned multi-layer patterning stack, which in turn are used to pattern underlying layers. The etching process(es) may include a reactive ion etch or plasma etching system. The dry etching process may implement a hydrogen-comprising etch gas (e.g., H2 and/or CH4), a nitrogen-comprising etch gas (for example, N2 and/or NH3), a chlorine-comprising etch gas (for example, Cl2, CHCl3, CCl4, and/or BCl3), an oxygen-comprising etch gas (for example, O2), a fluorine-comprising etch gas (for example, F2, CH3F, CH2F2, CHF3, CF4, C2F6, SF6, and/or NF3), a bromine-comprising etch gas (e.g., Br, HBr, CH3Br, CH2Br2, and/or CHBr3), an iodine-comprising etch gas, other suitable etch gas, or combinations thereof. In some embodiments, the dry etching process can use a carrier gas to deliver the etch gas. The carrier gas includes nitrogen, argon, helium, xenon, other suitable carrier gas constituent, or combinations thereof. The wet etching process may implement a wet etchant solution that includes $H_2SO_4$ (sulfuric acid), $H_2O_2$ (hydrogen peroxide), $NH_4OH$ (ammonium hydroxide), HCl (hydrochloric acid), HF (hydrofluoric acid), DHF (diluted HF), $HNO_3$ (nitric acid), $H_3PO_4$ (phosphoric acid), $H_2O$ (water) (which can be deionized water (DIW) or ozonated de-ionized water ($DIWO_3$)), ozone ($O_3$), other suitable chemicals, or combinations thereof.

Figure 12:
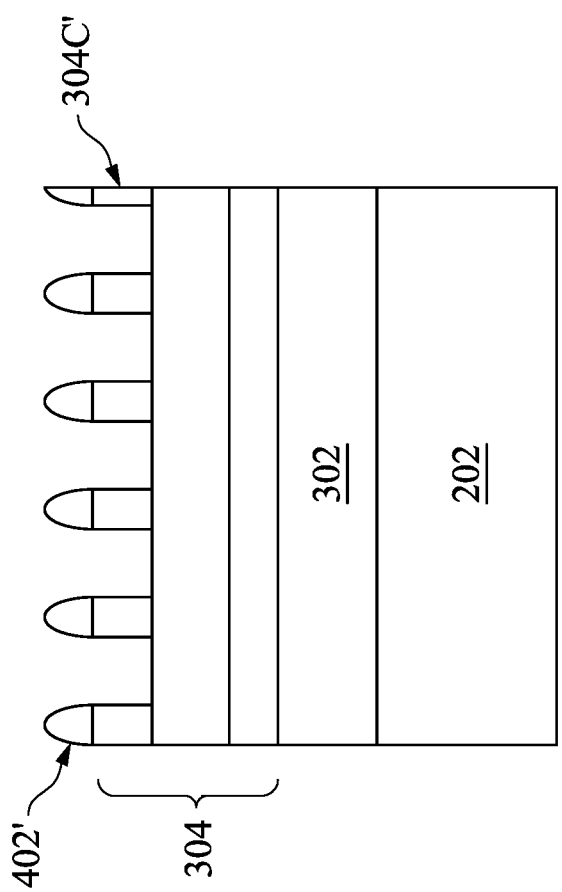

Referring to the example of FIG. 12, the patterned bottom layer 402' is used as a masking element while etching the masking layer 304 and in particular the dielectric layer 304C to form patterned layer 304C'. In an embodiment, the etching process is selective to the composition of the dielectric layer 304C, such as selective to silicon oxide. In some embodiments, the silicon-containing layer 502' is removed during the etching of the dielectric layer 304C. In some embodiments, the etching process stops at the hard mask layer 304B, for example, a metal hard mask composition. The etching process may provide for a rounded top surface of the patterned carbon-containing layer 402'.

Figure 13:
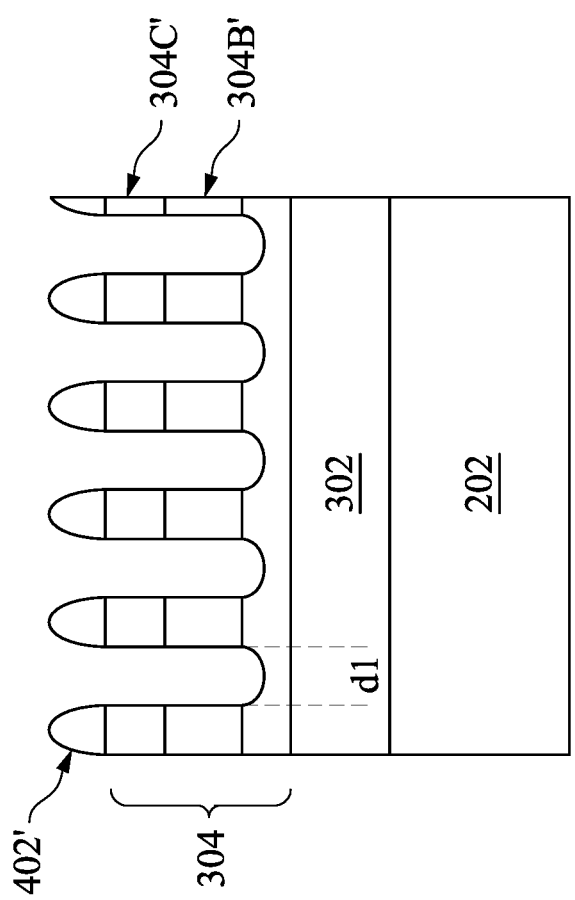

Referring to the example of FIG. 13, the patterned bottom layer 402' (and the patterned dielectric layer 304C') may be used as an etching mask during the etching of the masking layer 304 and in particular the metal hard mask layer 304B to form the patterned hard mask layer 304B'. In some implementations, etching the metal hard mask layer 304B includes an over-etch that extends into the underlying dielectric layer 304A (e.g., silicon oxide). Generally, the etchant however may be selective to the hard mask layer 304B' material.

Figure 14:
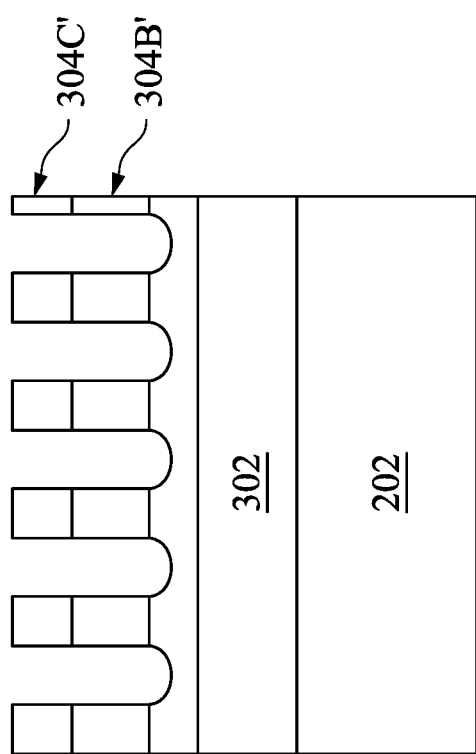
Figure 15:
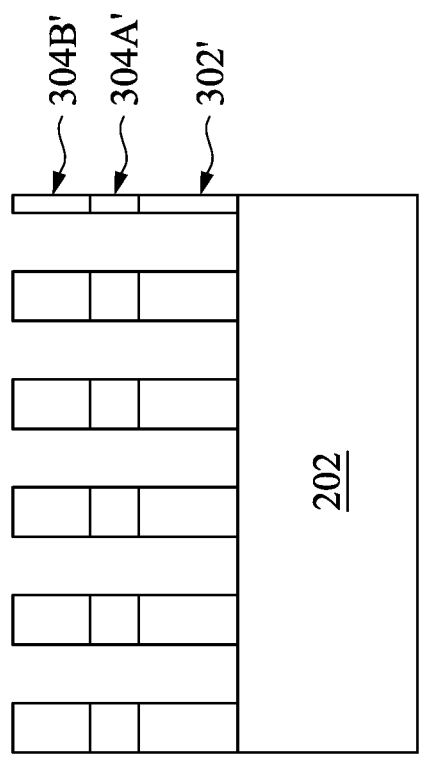
Figure 16:
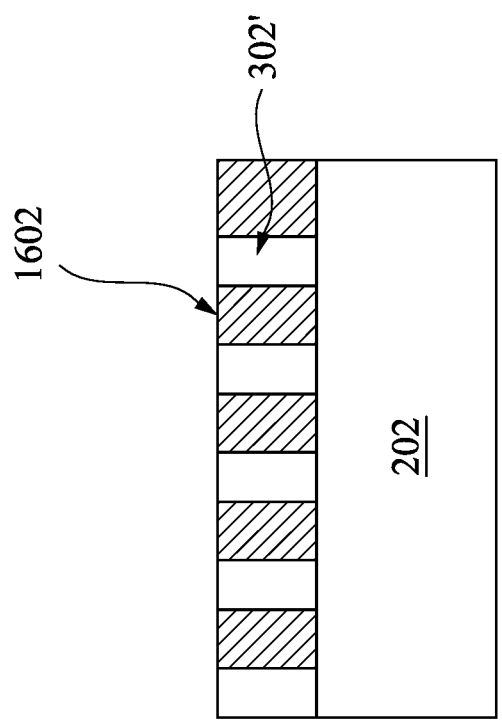

After the etching of the metal hard mask layer 304B, a flush or clean process may be performed. In some implementations, the flush process may remove the patterned bottom layer 402' as illustrated in FIG. 14. The patterned hard mask layer 304B' generally is suitable to provide a masking element for patterning underlying target layer(s).

The method 100 then proceeds to block 118 where the masking element developed by the previous blocks is used during the etching of a target layer(s). Referring to the example of FIG. 15, the target layer 302 is patterned by an etching process, while the patterned metal hard mask layer 304B' is used as a masking element defining the pattern to be formed. The patterned target layer 302' is provided with the same pattern as defined in the overlying resist layer 602 (in some embodiments, having been further defined by a trim process). It is noted in this respect, the method 100 has been described as providing a single patterning process (1 photolithography process); however, other embodiments that apply the method 100 including those with multiple-photo and etch processes are possible. For example, double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof.

In some embodiments, the underlying layer 304A is a similar composition to that of the target layer 302 and thus also patterned during the etching process to form patterned layer 304A'. In other embodiments, the layer 304A is patterned separately to form patterned layer 304A'. In an embodiment, any remaining portion of the hard mask layer 304 may be stripped off after patterning the target layer 302.

In some embodiments, the target layer 302 is an ILD layer and the patterned target layer 302' may define openings or trenches within which metallization of the MLI will be formed. In such an embodiment, the method 100 proceeds to filling the trenches with a conductive material, such as a metal; and polishing the conductive material using a process such as chemical mechanical planarization (CMP) to expose the patterned ILD layer, thereby forming the metal lines in the ILD layer. This is illustrated in the conductive features 1602 of FIG. 16, which may provide metal interconnect line.

In some embodiments, the target layer 302 is a conductive layer to be used for metal lines and is made of copper, aluminum, the like, or a combination thereof. In other embodiments, the target layer 302 is a dielectric layer, such as a low-k dielectric layer, a polymer layer, or the like. In another embodiment, the target layer is a material suitable for a gate structure forming a gate (or dummy gate structure) of a device, for example, polysilicon. In yet other embodiments, the target layer 302 is a substrate and is made of a semiconductor material such as silicon, germanium, or other suitable materials. In such an embodiment, the trenches formed in the target layer of the substrate may define isolation features between fin-like structures suitable for fabricating fin-type field effect transistors (FinFET). In an embodiment, the target layer 302 is a mandrel layer. The mandrel layer may be a masking material such as silicon nitride, an oxide, silicon, amorphous silicon, a combination thereof or any other material that may be patterned and selectively removed. The patterned mandrel layer is then used for further patterning processes for example to achieve smaller dimensions as part of a multi-patterning process such as applying the method 100 to a double patterning technique. The above are non-limiting examples of devices/structures that can be made and/or improved using the method 100 according to various aspects of the present disclosure.

In some embodiments, due to the properties of the patterning materials and/or steps discussed above, the patterned target layer has very smooth edges and sidewalls, therefore low line-edge roughness (LER) and line-width roughness (LWR) and/or improved local critical dimension uniformity (LCDU). In some embodiments, this is because the material and deposition process (e.g., ALD, CVD, PVD) forming the silicon-containing film, provide for a material layer that possess high density, improved hardness, desirable modulus, high etch selectivity and/or other benefits. In some implementations, the beneficial properties, such as high density, result because impurities and/or undesired bonding within the material layer can be dissociated by introduction of plasma in the deposition process. The film properties including density, modulus, hardness, etc may be modified through deposition processes knobs such as the gas flow (precursor, inert gases), power, process temperature, substrate temperature, and the like.

Figure 17:
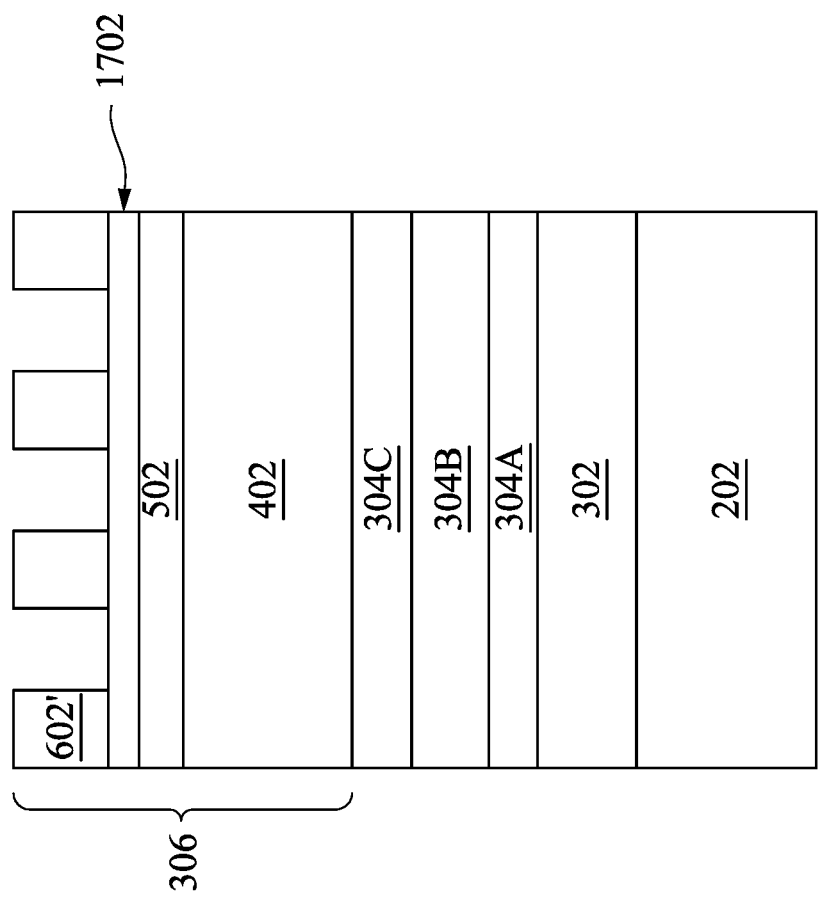
FIG. 17 provides a cross-sectional view of another example device having an adhesion layer and having aspects of which are fabricated according to the method of FIG. 1.

In an embodiment of the method 100, an additional block is provided in which an adhesion layer is formed in the multi-layer patterning stack. For example, in an embodiment, an adhesion layer may be formed between the middle layer (e.g., silicon-containing layer) and the overlying resist layer. The adhesion layer may include a material such as hexamethyldisilazane (HDMS) or a bottom antireflective coating (BARC). In some embodiments, the material of BARC is selected based on the lithography process to be formed such as to provide suitable anti-reflective properties depending on the wavelength of radiation. The thickness of the adhesion layer may be between approximately 0 and 100 Angstroms (Å). In the implementation of the adhesion layer being a surfactant, the thickness may be considered 0 Å due to its nature as a surface treatment. FIG. 17 is illustrative of an adhesion layer 1702 interposing the patterned resist 602' and the middle layer 502, a silicon-containing layer. FIG. 17 is substantially similar to FIG. 7 and the method 100 progresses with the adhesion layer substantially similar as above. The adhesion layer may be patterned with the middle layer 502.

In an implementation of the method 100, a topographically varying structure, such as a patterned layer, may be disposed under the multi-layer patterning stack. Referring to the example of FIG. 18, the multi-layer patterning stack including resist layer 602, the middle layer 502 and the bottom layer 402 is disposed over a plurality of features 1802 that are disposed on the masking layer 306.

Figure 18:
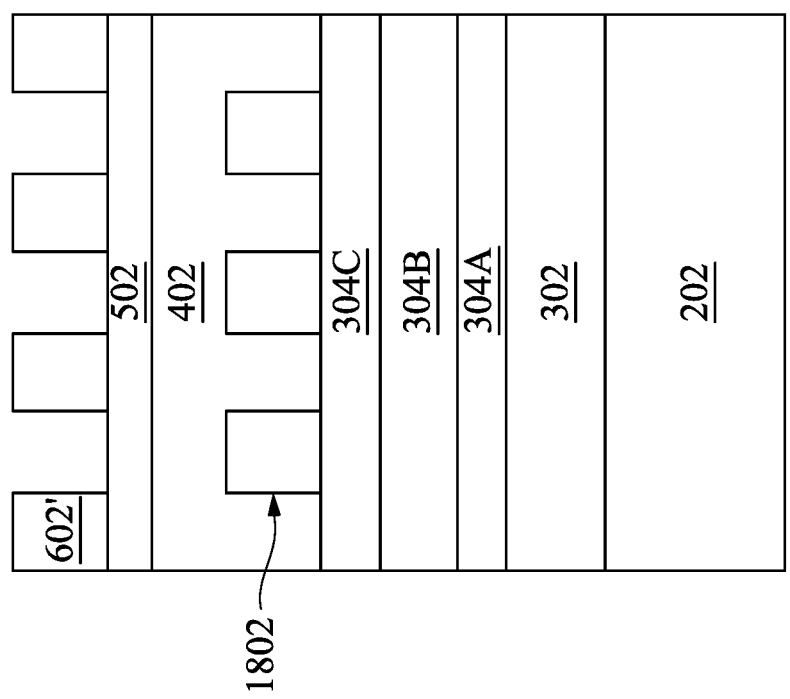
FIG. 18 provides a cross-sectional view of another example device having a patterned layer and having aspects of which are fabricated according to the method of FIG. 1.

As illustrated in FIG. 18, the bottom layer 402 directly interfaces the plurality of features 1802 and fills the gap therebetween. In some embodiments, the bottom layer 402 is thicker than the plurality of features 1802 by 1.2-4 times the height of the plurality of features 1802. In an embodiment, the bottom layer 402 is deposited by spin-on coating to provide suitable gap filling between the plurality of features 1802. After deposition, the bottom layer 402 may be planarized by a suitable process such as chemical mechanical polish (CMP) prior to formation of the second layer 502.

In an embodiment, the plurality of features 1802 are sacrificial mandrels (e.g., silicon or other sacrificial material) to be used in a multi-patterning scheme such as in a double patterning technique. For example, the method 100 may be employed using a layer of target material that is designed to form the plurality of features 1802. A first multi-layer patterning stack is provided over the target material to pattern the plurality of features 1802. The method 100 may repeat, forming a second multi-layer patterning stack over the plurality of features 1802. The second multi-layer patterning stack may further alter the plurality of features 1802 and/or a pattern of features formed from said plurality of features (e.g., spacer elements formed on the sidewalls of the plurality of features 1802).

Referring now to FIGS. 19 through 29B, illustrated is an embodiment of the method 100 implemented in a multi-patterning scheme including multiple photolithography and etch processes to pattern a target layer. FIGS. 19 through 29B provide an example of patterning of a back-end-of the line (BEOL) features. In particular, a metallization layer of a multi-layer interconnect is patterned. The description of the method 100 above applies in full force to the description of the embodiment illustrated by FIGS. 19 through 29B.

Figure 19:
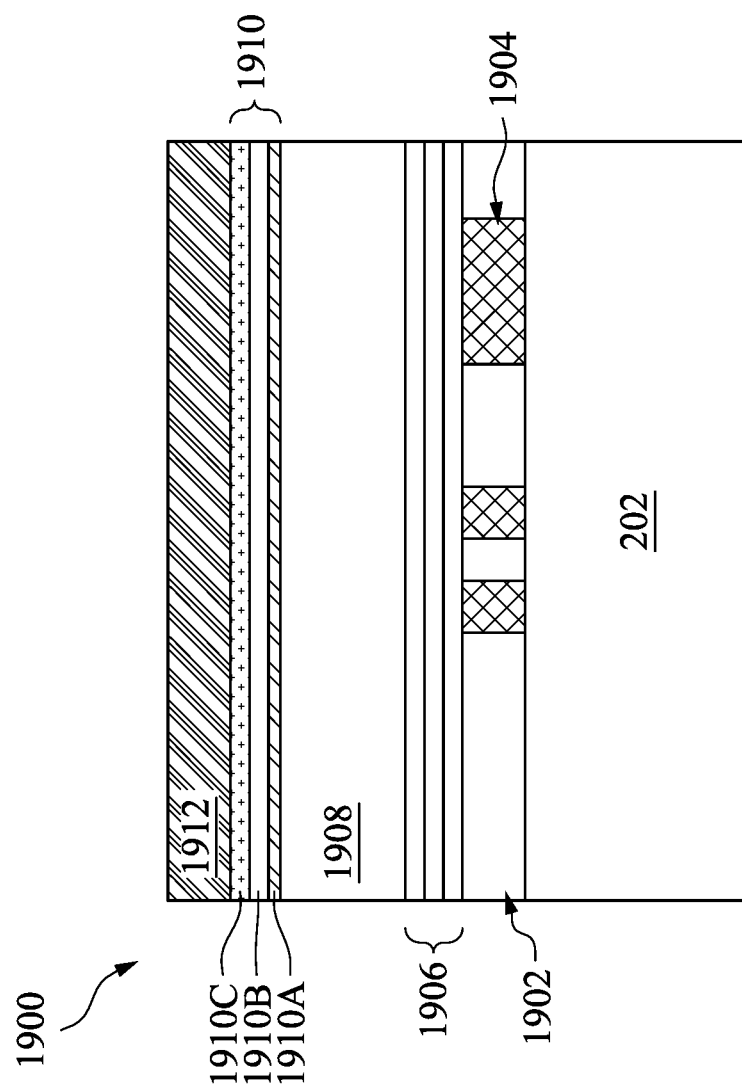

FIG. 19 illustrates a device 1900 having a semiconductor structure 202 with a plurality of layers formed thereon. In an embodiment, the semiconductor structure 202 is substantially similar as discussed above, including for example, the presence of active devices such as transistors. Over the semiconductor structure 202 is formed a first ILD layer 1902 and a first metallization layer 1904 of an MLI that interconnects the active devices on the semiconductor structure 202. The ILD layer may include a dielectric material including, for example, silicon oxide, carbon doped silicon oxide, silicon nitride, silicon oxynitride, TEOS-formed oxide, PSG, BSG, BPSG, FSG, xerogel, aerogel, amorphous fluorinated carbon, parylene, BCB-based dielectric material, polyimide, other suitable dielectric material, or combinations thereof. In some embodiments, ILD layer 1902 includes a dielectric material having a dielectric constant that is less than a dielectric constant of silicon dioxide (e.g., k<3.9). In some embodiments, ILD layer 1902 includes a dielectric material having a dielectric constant that is less than about 2.5 (i.e., an extreme low-k (ELK) dielectric material), such as silicon dioxide ($SiO_2$) (for example, porous silicon dioxide), silicon carbide (SiC), and/or carbon-doped oxide (for example, a SiCOH-based material (having, for example, Si—CH3 bonds)), each of which is tuned/configured to exhibit a dielectric constant less than about 2.5. The dielectric layer 1902 can include a multilayer structure having multiple dielectric materials. The first metallization layer 1904 may be a conductive material such as copper, aluminum, tungsten, and/or other suitable materials. The first metallization layer 1904 may be a multi-layer structure including for example, liner layers, barrier layers, adhesion layers, and/or other suitable layers.

An etch stop layer 1906 is disposed over the ILD layer 1902 and the first metallization layer 1904. In an embodiment, the etch stop layer 1906 includes multiple layers. The etch stop 1906 may include SiC, SiN, TEOS, hard black diamond (HBD), or other suitable composition. Over the etch stop layer 1906, another ILD layer 1908 is disposed. The ILD layer 1908 may be the target layer for patterning. For example, in some implementations, trenches are to be patterned in the ILD layer 1908 within which conductive material (e.g., copper) will be deposited to form a metallization layer by a damascene or dual-damascene process. In some embodiments, if the first metallization layer 1904 is metallization layer "M", the ILD layer 1908 and the metallization layer that is to be formed within said layer is metallization layer "M+1." The ILD layer 1908 may be substantially similar to the first ILD layer 1902 and may include the same or different composition than that of the first ILD layer 1902.

Above the target ILD layer 1908, a hard mask layer 1910 is disposed. In some implementations, the hard mask layer 1910 is substantially similar to the masking layer 304. In an embodiment, the hard mask layer 1910 includes a first layer 1910A, a second layer 1910B, and a third layer 1910C. In an embodiment, the third layer 1910C is a dielectric layer such as TEOS. In an embodiment, the second layer 1910B is a metal hard mask layer such as TiN. Other exemplary metal hard mask materials include Ti, Ta, W, TaN, WN, and/or other suitable compositions. In an embodiment, the first layer 1810A is a nitrogen free anti-reflection layer (NFARL).

A mandrel layer 1912 is disposed over the hard mask layer 1910. In an embodiment, the mandrel layer 1912 is silicon such as amorphous silicon, polysilicon, or other suitable composition. The mandrel layer 1912, when patterned, is used provide sacrificial features implemented to reduce the pitch of the patterned features by providing spacer material over the features/mandrels, providing spacer features on the sidewalls of the mandrels, and subsequently removing the mandrels to allow the spacer features to define a reduced pitch. The mandrel-spacer techniques include self-aligned double patterning (SADP) process which reduces the pitch of the exposed pattern by half, self-aligned quadruple patterning (SAQP) process which reduces the pitch of the exposed pattern by a quarter, and other spacer patterning processes.

Referring now to FIGS. 20A and 20B, a first photolithography process is performed. The first photolithography process may be referred to as a cut process providing in some embodiments to define a space between subsequently formed metallization features. FIG. 20A illustrates that the first lithography process includes forming a multi-layer patterning stack 604 over the mandrel layer 1912. The multi-layer patterning stack 604 includes a bottom layer (carbon-containing layer) 402, a middle layer (silicon-containing layer) 502, and a resist layer that is patterned by the first photolithography process to provide patterned resist layer 602". The multi-layer patterning stack 604 is substantially similar to as discussed above including providing a organic layer 402. In an embodiment, the silicon-containing layer 502 (e.g., a-Si) is deposited by at least one of CVD, PVD, or ALD processes. In an embodiment, the patterned resist layer 602" is patterned by an EUV process. In other embodiments, other lithography techniques may be implemented.

Figures 21A, 21B:
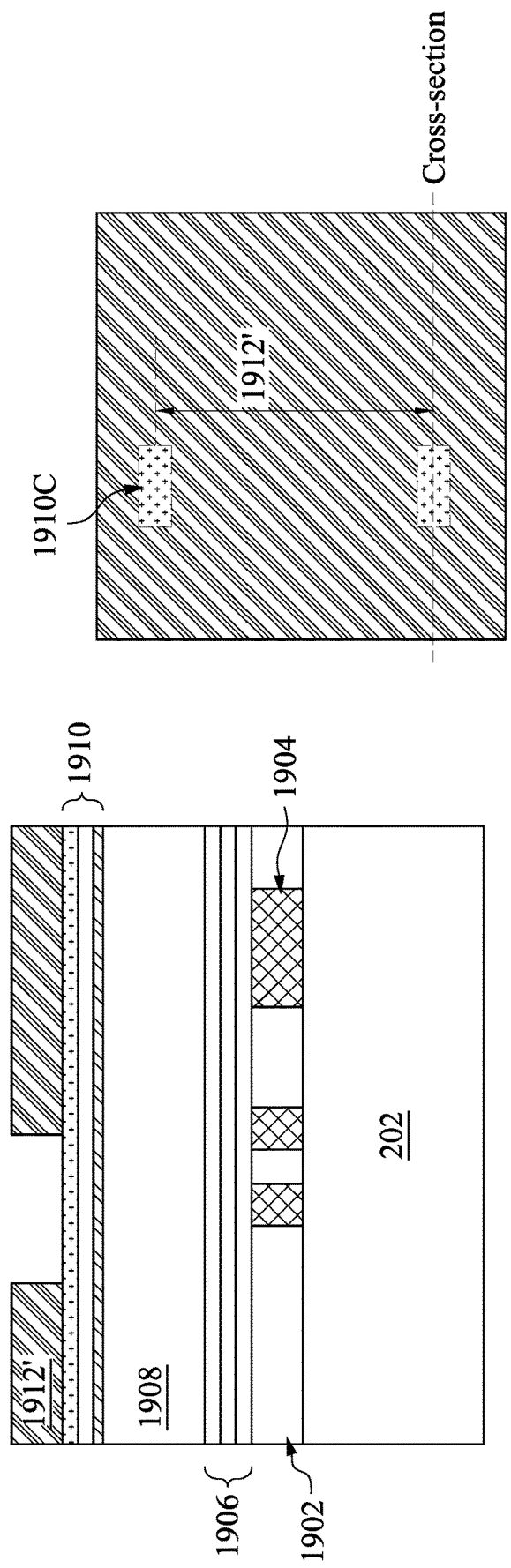

FIGS. 21A and 21B illustrate the device 1800 after an etching process providing the pattern of FIGS. 20A and 20B is performed. The etching process patterns the mandrel layer 1912 to form a patterned mandrel layer 1912'. The multi-layer patterning layer 604 is used as a masking element during the etching to form the patterned mandrel layer 1912'. After the etching process, the first multi-layer patterning layer 604 may be removed.

Figure 22:
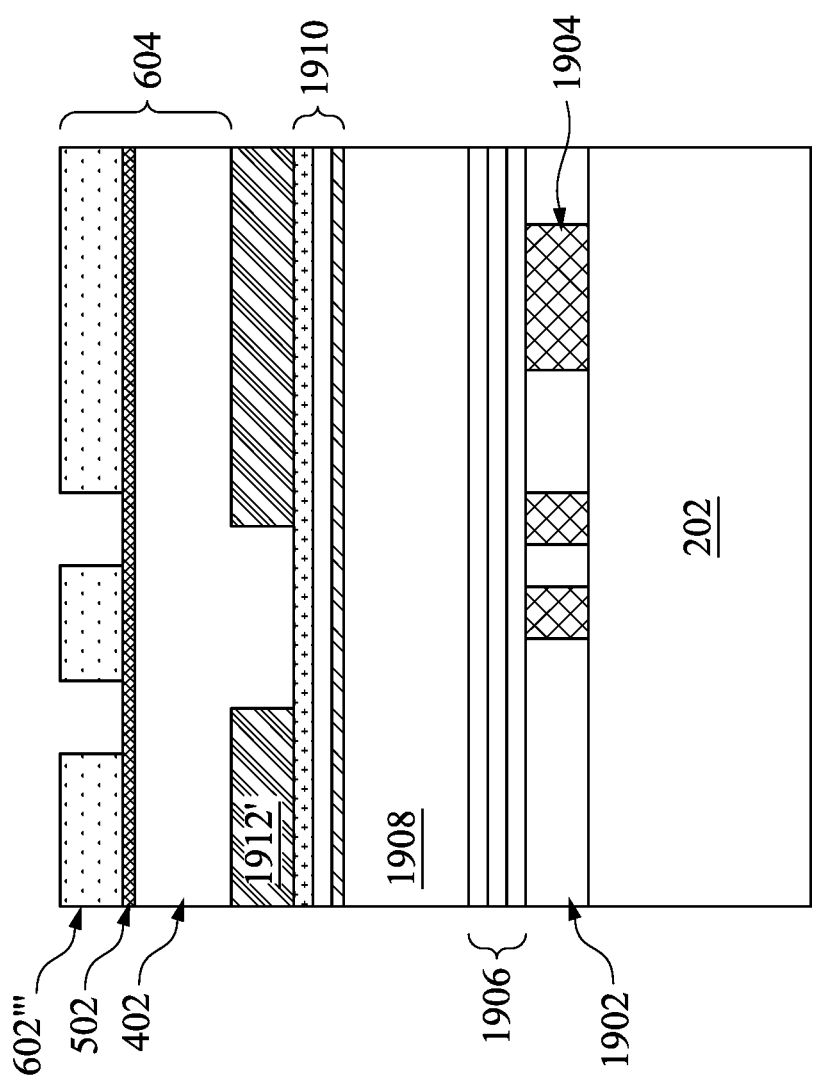

Referring now to FIG. 22, a second photolithography process is performed. The second photolithography process may define portions of a metallization routing layout including a first set of metallization lines. FIG. 22 illustrates that the second lithography process includes forming another multi-layer patterning stack 604 over the mandrel layer 1912. The multi-layer patterning stack 604 includes a bottom layer (organic layer) 402, a middle layer (silicon-containing layer) 502, and a resist layer that is patterned by the second photolithography process to provide patterned resist layer 602'". The multi-layer patterning stack 604 is substantially similar to as discussed above including providing an organic layer 402 and/or a silicon-containing layer 502 deposited by at least one of CVD, ALD, or PVD processes. The multi-layer patterning stack 604 is formed over a topographically varying feature—the patterned mandrel layer 1912'. In an implementation, the organic layer 402 directly interfaces the patterned mandrel layer 1912'. In an embodiment, the organic layer 402 is deposited by spin-on processes to provide suitable gap filling. In an embodiment, the organic layer 402 is an a-C layer formed by one of CVD, ALD, or PVD. In an embodiment, the patterned resist layer 602'" is formed by an EUV process. In other embodiments, other lithography techniques may be implemented.

Figures 23A, 23B:
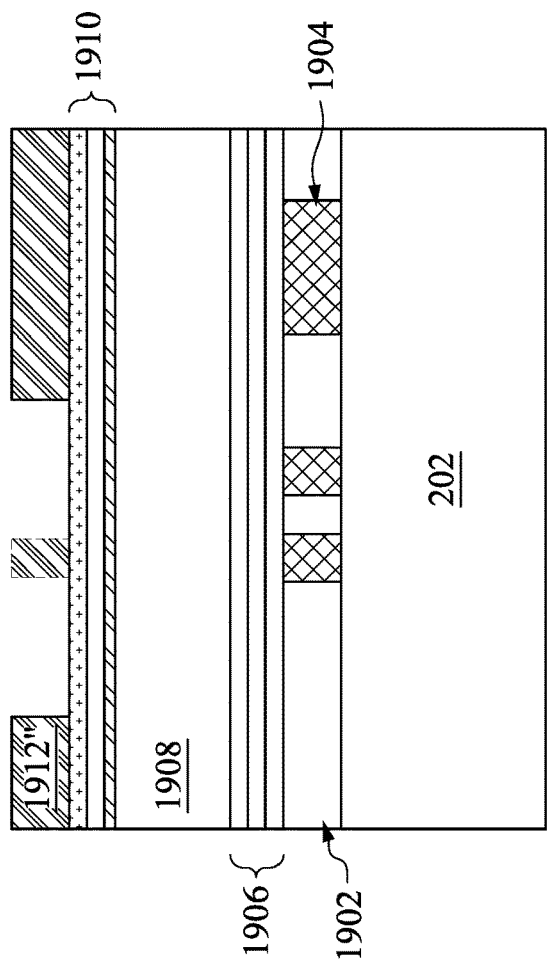

FIGS. 23A and 23B illustrate the device 1800 after an etching process providing the pattern of FIG. 22 is performed. The etching process further patterns the mandrel layer 1912' to form a patterned mandrel layer 1912". The multi-layer patterning layer 604 of FIG. 21 is used as a masking element during the etching to form the patterned mandrel layer 1912". After the etching process, the multi-layer patterning layer 604 may be removed.

Figures 24A, 24B:
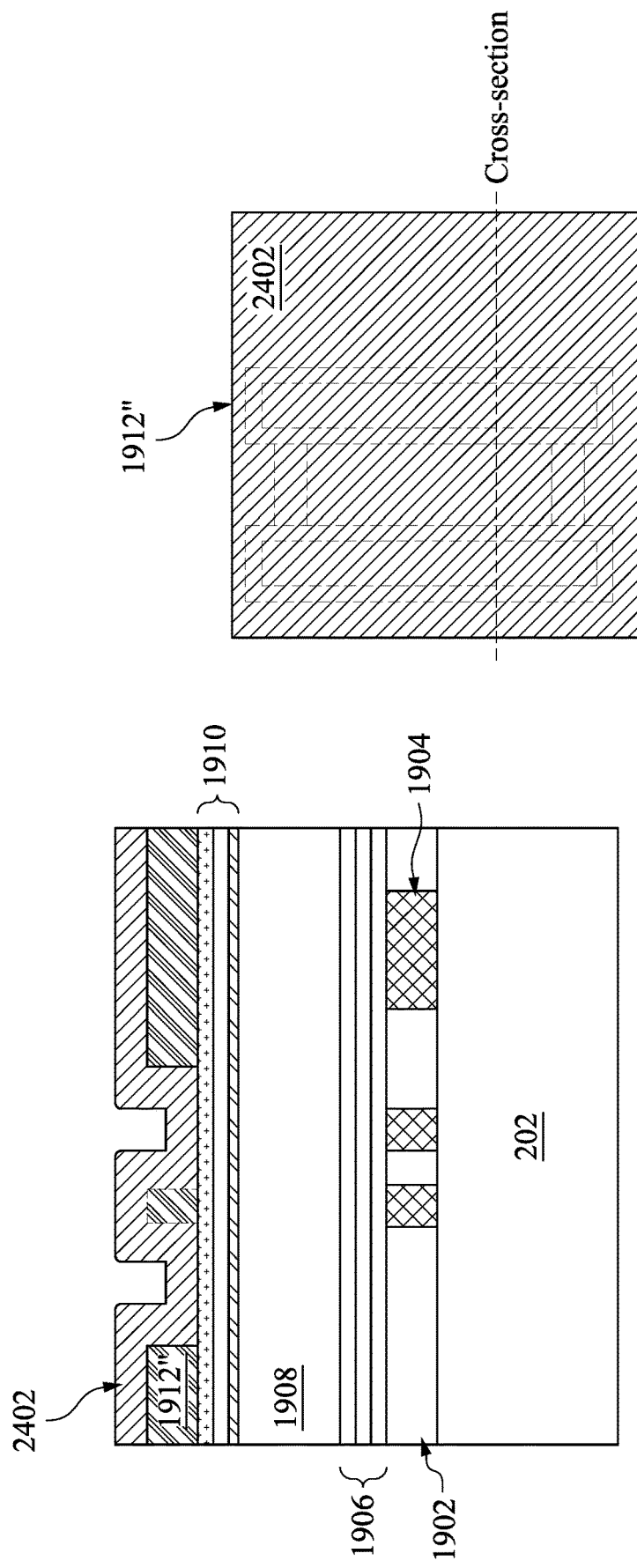

Referring now to FIGS. 24A and 24B, a conformal spacer material layer 2402 is formed over the semiconductor structure 202 including the mandrels 1912". The spacer material layer 2402 may include a dielectric material such as, titanium nitride, silicon nitride, silicon oxide, titanium oxide, and/or other suitable materials. The spacer material layer 2402 can be formed by various processes, including a deposition process by a CVD or PVD process.

Figure 25B:
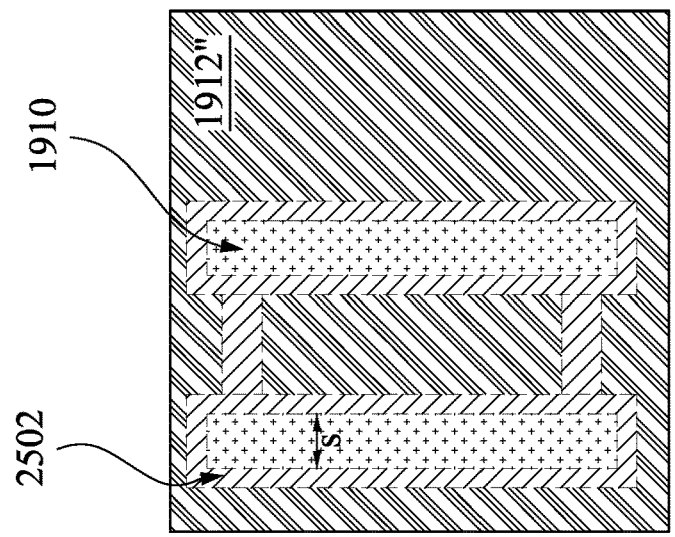
Figure 25A:
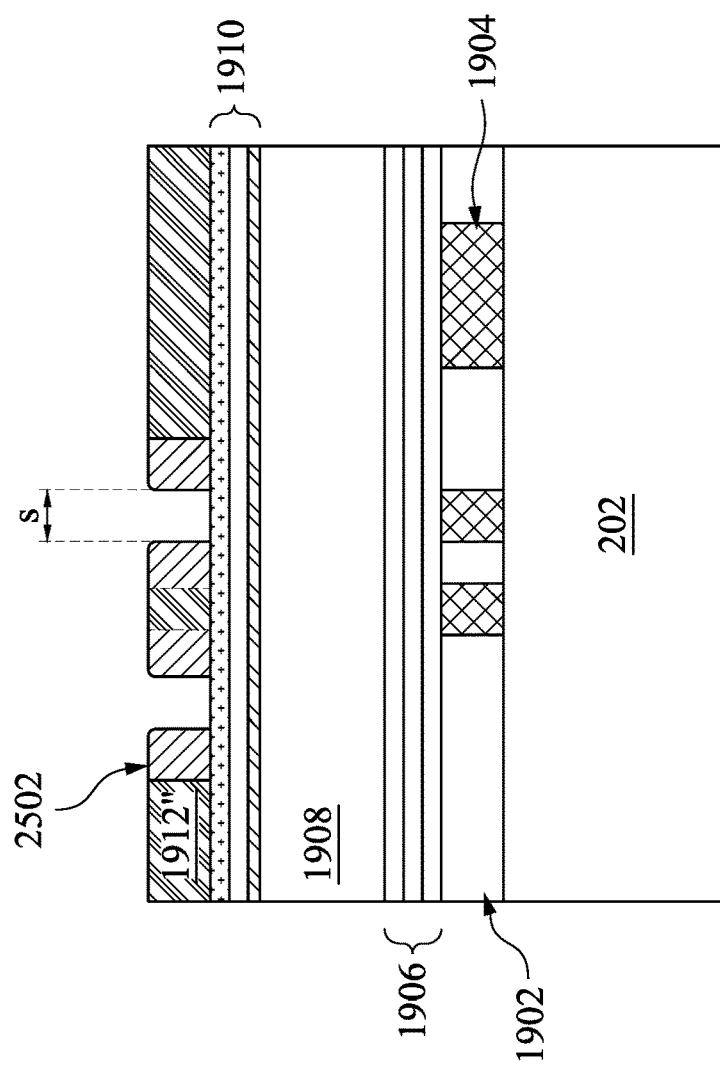

Referring now to FIGS. 25A and 25B, the conformal spacer material layer 2402 of FIGS. 24A and 24B is etched back to form spacer elements 2502. The etching process may be an anisotropic etching process such as by plasma etching. The width of the spacing "s" may be reduced such that it is below the resolution of the lithography technique applied.

Figure 26B:
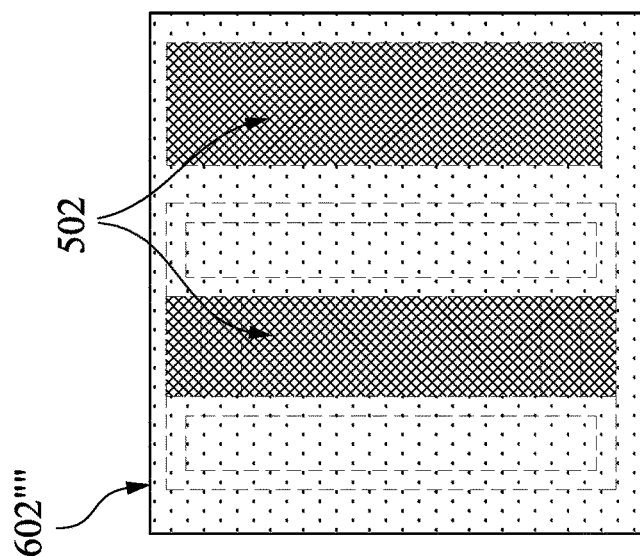
Figure 26A:
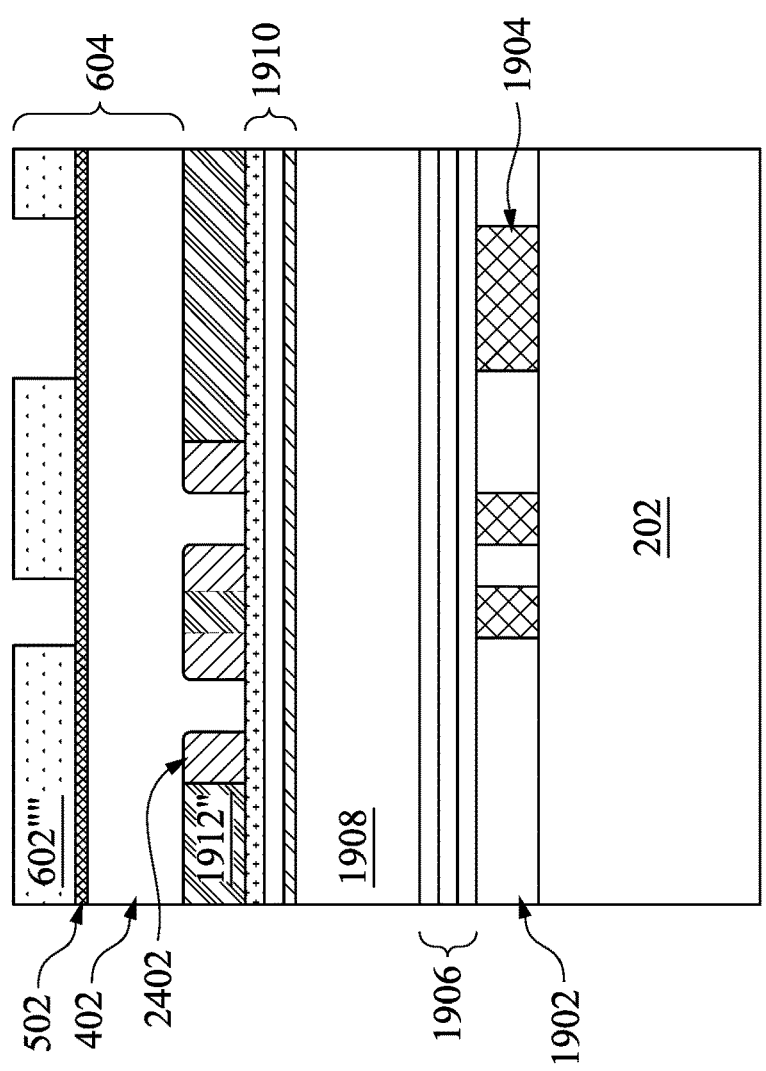

Referring now to FIGS. 26A and 26B, a third photolithography process is performed. The third photolithography process may define portions of a metallization routing layout including a second set of metallization lines. FIGS. 26A and 26B illustrate that the third lithography process includes forming another multi-layer patterning stack 604 over the patterned mandrel layer 1912" and the spacer elements 2502. The multi-layer patterning stack 604 includes a bottom layer (organic layer) 402, a middle layer (silicon-containing layer) 502, and a resist layer that is patterned by the second photolithography process to provide patterned resist layer 602"". The multi-layer patterning stack 604 is substantially similar to as discussed above including providing a silicon-containing layer 502 deposited by at least one of CVD, ALD, or PVD processes. The multi-layer patterning stack 604 is formed over a topographically varying feature—the patterned mandrel layer 1912" and spacer elements 2502. In an implementation, the organic layer 402 is deposited by spin-on coating to adequately fill the gaps between the mandrel layer 1912". In a further embodiment, a carbon-containing layer 402 (a-C) is formed by PVD, CVD, or ALD over each of the patterned mandrel layer 1912" and the spacer elements 2502. In an embodiment, the patterned resist layer 602"" is formed by an EUV process. In other embodiments, other lithography techniques may be implemented.

Figure 27B:
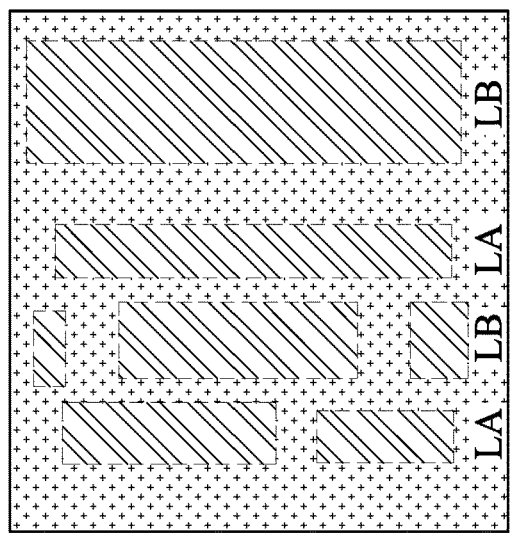
Figure 27A:
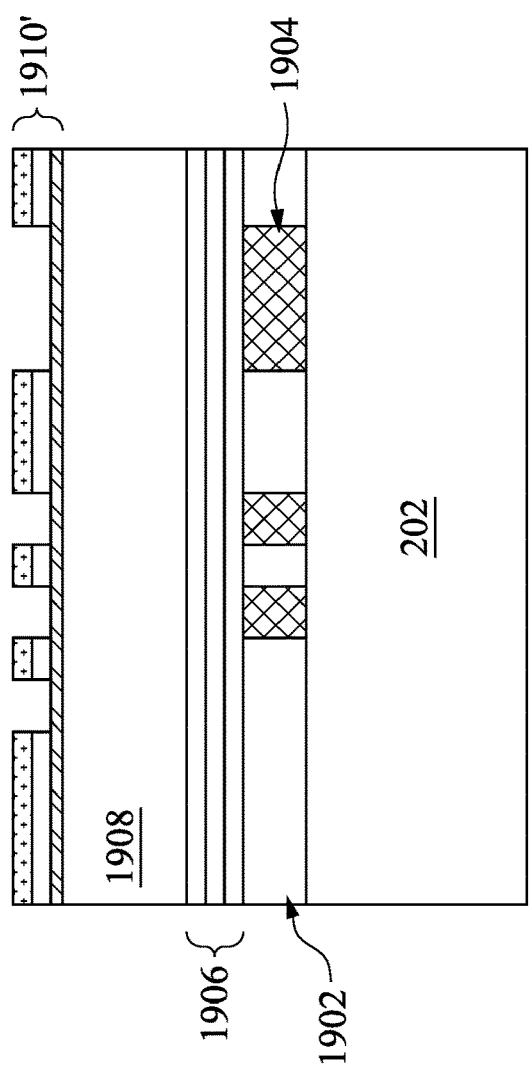

FIGS. 27A and 27B illustrate the device 1800 after an etching process providing the pattern of FIGS. 26A and 26B in combination with the previously formed patterned mandrel layer 1912". Specifically, the resist 602"" provides openings where certain portions of the patterned mandrel layer 1912" are removed (e.g., between spacer elements 2502 at the center of the illustrated portion of device 1800). Afterward, the masking layer 1910 may be etched according to the pattern provided by the mandrel and spacer elements (i.e., the summation of the first, second and third lithography processes) thereby providing patterned masking layer 1910'. The patterned masking layer 1910' includes patterning the hard mask layer 1910B. After patterning to for the patterned masking layer 1910', the overlying layers may be removed.

Figure 28B:
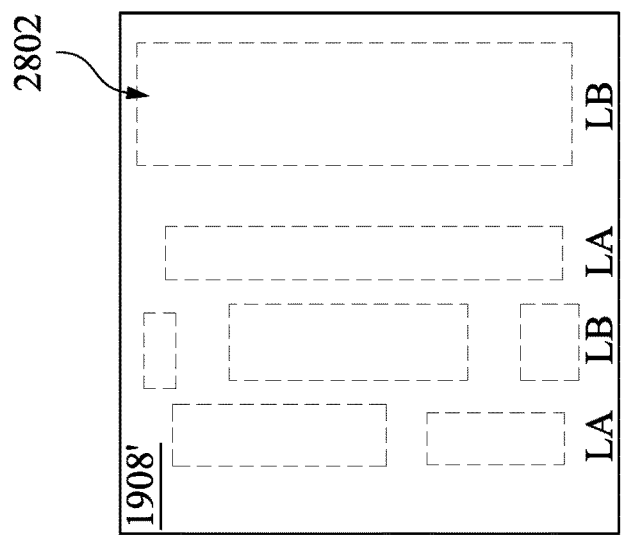
Figure 28A:
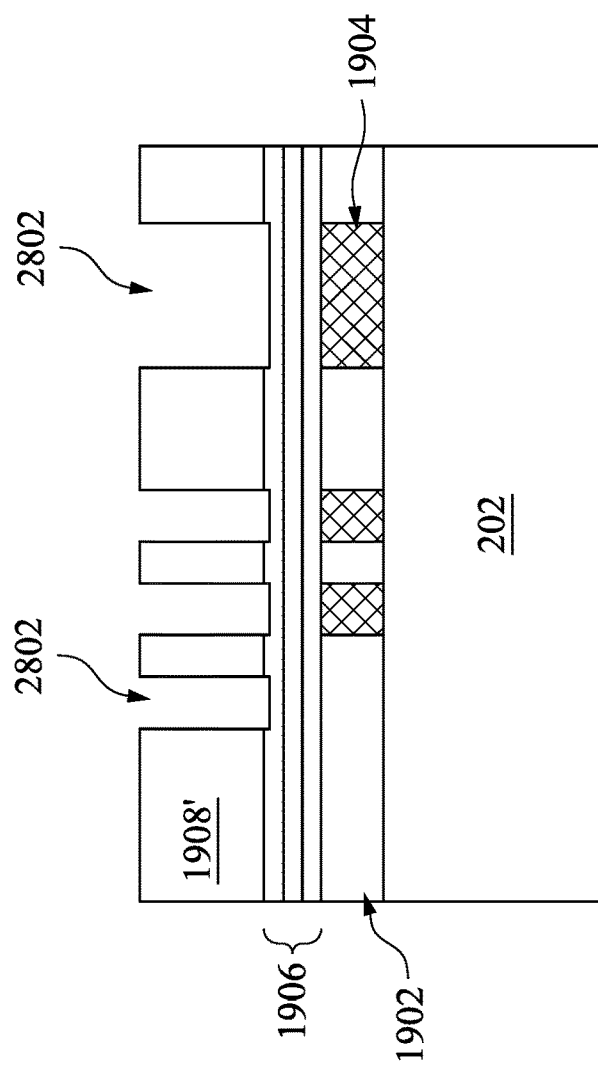
Figure 29B:
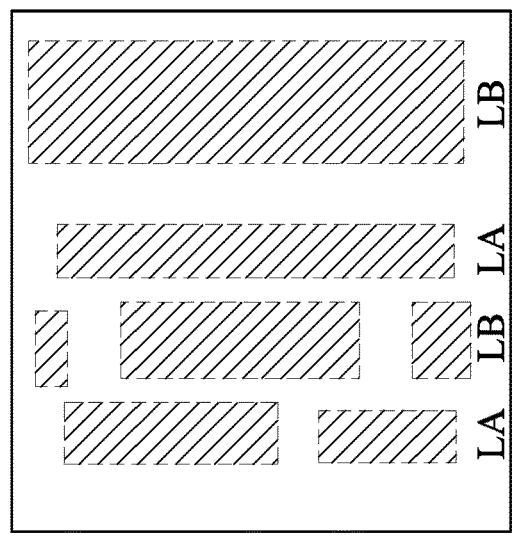
Figure 29A:
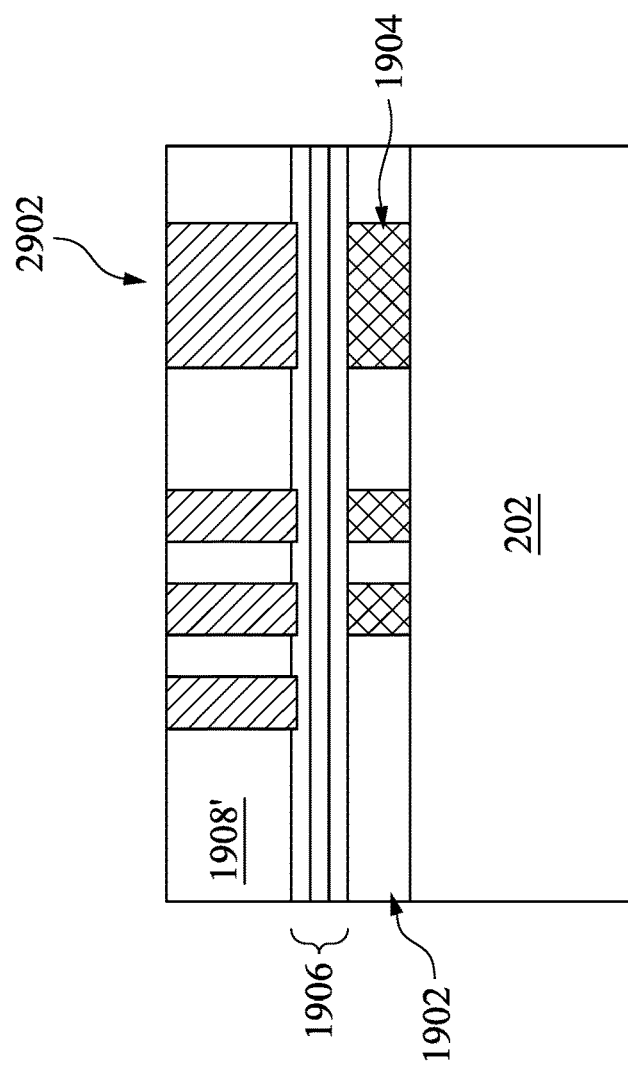

FIGS. 28A and 28B illustrate a subsequent step of providing a pattern of trenches and via openings according to the pattern of the masking layer 1910' into the target ILD layer 1908, thereby providing patterned target ILD layer 1908'. The trenches and via openings 2802 define the routing of the metallization layers and/or vias of a layer of the MLI structure of device 1800. Thus, the trenches and via openings 2802 are subsequently filled with conductive material to provide interconnects 2902 of FIGS. 29A and 29B. The interconnects 2902 may include copper, aluminum, alloys, and/or other suitable conductive materials. The interconnects 2902 may include a multi-layer structure includes barrier layers, seed layers, liner layers, and the like. Exemplary barrier layers include titanium, titanium nitride, tantalum, tantalum nitride, or other alternatives. After deposition of the conductive material, various processes such as a planarization process (e.g., CMP) may be formed.

Thus, the series of FIGS. 19-29B provide for an exemplary implementation of the method 100. As illustrated, the method 100 can be implemented multiple times in order to pattern a single target layer. The properties of the multi-layer patterning stack 604 can provide, in some implementations, an improvement of pattern quality. For example, LWR and/or LCDU may be improved for the patterned silicon-containing layer (and in some embodiments, the patterned carbon-containing layer), which allows for improved fidelity of the reproduction of the pattern. While not wanting to be constrained to any theory, it is believed that the deposition processes and/or material composition of the multi-layer patterning stack can provide for material properties that allow for improved performance in the patterning process such as increased density, hardness, desired modulus or high etch selectivity.

FIG. 30 illustrates a fabrication tool 3000 that may be used to perform one of more steps of the methods discussed herein. In an embodiment, the fabrication tool 3000 is a chemical vapor deposition tool. In an embodiment, the fabrication tool 3000 is an atomic layer deposition tool. In an embodiment, the fabrication tool 3000 is a physical vapor deposition tool. In particular, the fabrication tool 3000 may be used to deposit the silicon-containing layer as discussed above. In some embodiments, the fabrication tool 300 may further be used to deposit the carbon-containing layer. In some implementations, precursors in gaseous form are provided to the chamber 3002. Between an upper cathode and a lower cathode, a semiconductor structure such as the semiconductor structure 202 is provided. The semiconductor structure 202 may be in the form of a wafer. An RF power is provided to the upper electrode. The heat, pressure and/or power or plasma-creation applied to the chamber 3002 may assist in the reaction of precursor gases. The reaction creates a layer on the structure 202. As discussed above, in some implementations, this layer is an amorphous silicon layer.

FIG. 30 illustrates an exemplary precursor to forming a silicon-containing layer including silane. This precursor enters the chamber as is disassociated into silicon and hydrogen, which are then either deposited or outgassed from the chamber 3002.

In one exemplary aspect, the present disclosure is directed to a method for lithography patterning. The method includes providing a substrate and forming a target layer over the substrate. A patterning layer is formed by depositing a first layer having an organic composition; depositing a second layer including over 50 atomic percent of silicon; and depositing a photosensitive layer on the second layer.

In an embodiment, the target layer is an interlayer dielectric (ILD) layer formed over the substrate. In a further embodiment, the method includes defining a metallization layer to be formed in the ILD layer. In an embodiment, depositing the second layer is performed by chemical vapor deposition (CVD), atomic layer deposition (ALD), or physical vapor deposition (PVD). In a further embodiment, depositing the photosensitive layer is performed by spin-on coating. In an embodiment, depositing the second layer includes forming an amorphous silicon (a-Si) layer. The amorphous silicon layer may be hydrogenated a-Si.

In an embodiment, depositing the first layer includes depositing a spin-on anti-reflective coating layer. In an embodiment, depositing the first layer includes depositing amorphous carbon. In a further embodiment, the amorphous carbon is deposited by at least one of atomic layer deposition (ALD), physical vapor deposition (PVD), or chemical vapor deposition (CVD). In an implementation of the method, an adhesion layer is deposited between the second layer and the photosensitive layer.

In another exemplary aspect, the present disclosure is directed a method for lithography patterning including providing a target layer. A organic bottom layer of a multi-layer patterning stack is deposited. A silicon-containing layer of the multi-layer patterning stack is formed over the organic bottom layer using a deposition process providing of precursors delivered toward a surface of the organic bottom layer and chemically modifying the precursors to obtain the silicon-containing layer on the surface. The silicon-containing layer has at least 50% silicon. A resist layer is formed over the silicon-containing layer. A portion of the resist layer is exposed to a radiation to provide a patterned resist layer. A portion of the silicon-containing layer uncovered by the patterned resist layer is etched to form a patterned silicon-containing layer. After etching the portion of the silicon containing layer, a portion of the organic bottom layer uncovered by the patterned silicon-containing layer is etched to form a patterned organic bottom layer. The patterned bottom organic layer is used to define a pattern in the target layer.

In an embodiment of the method, the deposition process is chemical vapor deposition (CVD) or physical vapor deposition (PVD). In an implementation of the method, the patterned bottom organic layer is trimmed prior to using the patterned bottom organic layer to define the pattern. In an embodiment, the radiation is at an extreme ultraviolet (EUV) wavelength.

In another exemplary aspect, the present disclosure is directed to a method of patterning a semiconductor device. The method includes depositing a carbon-containing layer over a substrate. An amorphous silicon layer is deposited directly on the carbon-containing layer. A photosensitive layer is spin coated over the amorphous silicon layer. Using a lithography process, the photosensitive layer is patterned to provide a first opening. The method continues to include etching the amorphous silicon layer through the first opening where the etched amorphous silicon layer is used as a masking element during an etching of the deposited carbon-containing layer.

In an embodiment of the method, depositing the carbon-containing layer includes forming amorphous carbon. In an embodiment, depositing the amorphous silicon layer includes chemical vapor deposition, atomic layer deposition, or physical vapor deposition. In an embodiment, etching the amorphous silicon layer introduces atoms from an etching gas into the amorphous silicon layer to form a transformed silicon layer. In some implementations, the introduced atoms are oxygen.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method for lithography patterning, comprising:
   providing a substrate;
   forming a target layer over the substrate;
   forming a patterning layer over the target layer, wherein the forming the patterning layer, includes:
   using atomic layer deposition (ALD) process to deposit a first layer having an organic composition;
   continuing the ALD process to deposit a second layer including over 50 atomic percent of silicon, the second layer deposited directly on the first layer, and
   during the ALD process, delivering precursors to the substrate to form a continuous variation in a carbon (C) to silicon (Si) ratio in the first layer and the second layer; and
   depositing a patterning layer on the second layer.

2. The method of claim 1, wherein the target layer includes an interlayer dielectric (ILD) layer formed over the substrate.

3. The method of claim 2, wherein the patterning layer defines a metallization layer to be formed in the ILD layer; and
   recessing an upper surface of the second layer to form a curvilinear upper surface extending between features of the patterning layer.

4. The method of claim 3, further comprising: trimming a width of the second layer after the recessing the upper surface of the second layer to from a curvilinear upper surface.

5. The method of claim 1, further comprising:
   using the deposited patterning layer to define a metal interconnect line pattern in the target layer.

6. The method of claim 1, wherein the depositing the second layer includes forming an amorphous silicon (a-Si) layer.

7. The method of claim 6, wherein the depositing the first layer includes depositing amorphous carbon.

8. The method of claim 1, further comprising: depositing an adhesion layer between the second layer and the patterning layer.

9. A method for lithography patterning, comprising:
   depositing an organic bottom layer over a masking layer disposed over a target layer;
   forming a silicon-containing layer over the organic bottom layer using a deposition process providing of precursors delivered toward a surface of the organic bottom layer and chemically modifying the precursors to obtain the silicon-containing layer on the surface, wherein the silicon-containing layer has at least 50% silicon;
   forming a patterned resist layer over the silicon-containing layer, the patterned resist layer including a first resist feature;
   performing a first etching process to decrease a height of the first resist feature and etch an upper surface of the silicon-containing layer to form a curvilinear surface;
   after performing the first etching process, performing a second etching process of the silicon-containing layer to form a first masking feature of the silicon-containing layer having tapered sidewalls and a second masking feature of the silicon-containing layer having tapered sidewalls, wherein an opening extends between the tapered sidewalls of the first and second masking features;
   after the second etching process, performing a third etching process of the organic bottom layer under the opening of the second etching process to reduce a height of the silicon-containing layer; and
   forming interconnect features according to a pattern defined in the organic bottom layer.

10. The method of claim 9, further comprising: reducing a width of the patterned bottom organic layer prior to forming interconnect features.

11. The method of claim 9, wherein the first etching process includes introducing oxygen atoms.

12. The method of claim 11, wherein the second etching process includes introducing oxygen atoms in a dry etching process.

13. The method of claim 9, wherein the patterned resist layer is formed directly on the silicon-containing layer.

14. A method for lithography patterning, comprising:
    depositing a layer over a substrate;

forming a plurality of features extending from the layer;

forming a patterning layer over the layer and the plurality of features, wherein the forming the patterning layer, includes:

using atomic layer deposition (ALD) process to deposit a first layer having an organic composition interfacing a sidewall of a first feature of the plurality of features;

continuing the ALD process to deposit a second layer including over 50 atomic percent of silicon, wherein the depositing the first layer and the depositing the second layer are performed in-situ, and during the ALD process, delivering precursors to the substrate to form a continuous variation in a carbon (C) to silicon (Si) ratio in the first layer and the second layer; and depositing a photosensitive layer over the second layer.

15. The method of claim 14, wherein the plurality of features are mandrels.

16. The method of claim 15, wherein a height of the first layer is about 1.2 to 4 times a height of the plurality of features.

17. The method of claim 14, wherein forming the plurality of features includes forming features comprising silicon.

18. The method of claim 14, wherein the depositing the first layer and the depositing the second layer is performed at room temperature.

19. The method of claim 14, further comprising:

etching the second layer, wherein after the etching a first thickness of the second layer remains and a second thickness of the first layer remains, wherein a ratio of the first thickness to the second thickness is between 2:1 and 10:1.

20. The method of claim 14 wherein the forming the plurality of features includes forming a first feature and a second feature with a gap extending between the first feature and the second feature, wherein the first layer completely fills the gap.

* * * * *